(12) United States Patent
Yu

(10) Patent No.: US 6,300,612 B1
(45) Date of Patent: Oct. 9, 2001

(54) IMAGE SENSORS MADE FROM ORGANIC SEMICONDUCTORS

(75) Inventor: Gang Yu, Santa Barbara, CA (US)

(73) Assignee: Uniax Corporation, Santa Barbara, CA (US)

( * ) Notice: Subject to any disclaimer, the term of this patent is extended or adjusted under 35 U.S.C. 154(b) by 0 days.

(21) Appl. No.: 09/241,657

(22) Filed: Feb. 2, 1999

Related U.S. Application Data

(60) Provisional application No. 60/073,347, filed on Feb. 2, 1998.

(51) Int. Cl.[7] .................................................. H01L 27/00
(52) U.S. Cl. ..................................... 250/208.1; 250/214.1; 257/40
(58) Field of Search ........................... 250/208.1, 208.2, 250/226, 214 R, 214 SG, 214.1, 216; 257/40, 431, 440, 443, 460; 136/252, 255, 263, 40, 431, 440, 443

(56) References Cited

U.S. PATENT DOCUMENTS

| | | | |
|---|---|---|---|
| 4,175,981 | * 11/1979 | Loutfy | 136/255 |
| 4,175,982 | * 11/1979 | Loutfy | 136/255 |
| 4,514,755 | 4/1985 | Tabei . | |
| 4,560,866 | * 12/1985 | Takenouchi et al. | 250/216 |

(List continued on next page.)

FOREIGN PATENT DOCUMENTS

| | | |
|---|---|---|
| 2166289 | 4/1986 | (GB) . |
| 59227171 | 12/1984 | (JP) . |
| 59229863 | 12/1984 | (JP) . |
| 60128785 | 7/1985 | (JP) . |
| 63300574 | 12/1988 | (JP) . |
| 63300576 | 12/1988 | (JP) . |
| 07099297 | 4/1995 | (JP) . |

OTHER PUBLICATIONS

Karg. S. et al., Electrical and optical characterization of poly(phenylene–vinylene) light emitting diodes, Synthetic Metals, 1993, 427–433, 54, Elsevier Sequoiac.

Shirotani, Ichimin et al., Electrical conductivity of one–dimensional hologen–bridged metal complexes at high pressures, Synthetic Metals, 1994, 265–270, 64, Elsevier Sciece S.A.

Yu, G. et al., Dual–function semiconducting polymer devices: Light–emitting and photodetecting diodes, Appl. Phys. Lett. , Mar. 1994, 1540–1542, 64 (12) American Institute of Physics.

Marks, R. N. et al., The photovoltaic response in poly(p–phenylene vinylene) thin–film devices, J. Phys.: Condens. Matter, 1994, 1379–1394, 6, IOP Publishing Ltd.

(List continued on next page.)

*Primary Examiner*—John R. Lee

(57) ABSTRACT

Image sensors with monochromatic or multi-color response made from organic semiconductors are disclosed. The image sensors are comprised of image sensing elements (pixels) each of which comprises a thin layer (or multiple layers) of organic semiconductor(s) sandwiched between conductive electrodes. These image sensors can be integrated or hybridized with electronic or optical devices on the same substrate or on different substrates. The electrical output signals from the image sensors resulting from the input image are probed by a circuit connected to the electrodes. The spectral response of the image sensing, elements can be modified and adjusted to desired spectral profiles through material selection, through device thickness adjustment and/or through optical filtering. Several approaches for achieving red, green, and blue full-color detection are disclosed. Similar approaches can be used for multiple-band detection (wavelength multiplexing) in desired response profiles and in other selected spectral ranges.

26 Claims, 15 Drawing Sheets

U.S. PATENT DOCUMENTS

| | | |
|---|---|---|
| 5,331,183 | 7/1994 | Sariciftci et al. . |
| 5,424,560 | 6/1995 | Norman et al. . |
| 5,454,880 | 10/1995 | Sariciftci et al. . |
| 5,504,323 | 4/1996 | Heeger et al. . |
| 5,523,555 * | 6/1996 | Friend et al. .................... 250/214 R |
| 5,698,048 * | 12/1997 | Friend et al. ........................ 136/263 |

OTHER PUBLICATIONS

Yu, G. et al., Semiconduction polymer diodes: Large size, low cost photodetectors with excellent visible–ultaviolet sensitivity, Jun. 20, 1994, 3422–3424, 64 (25), American Institute of Physics.

Sariciftci, N. S. et al., Photoinduced Electron Transfer from a Conducting Polymer to Buckminsterfullerene, Science, Nov. 27, 1992, 1474–1476, 258.

L. Smilowitz, L. et al., Photoexcitation spectroscopy of conducting–polymer $C_{60}$ composites: Photoinduced electron transfer, Physical Review B, May 15, 1993, 13 835–13 842, 47 (20), The American Physical Society.

Sariciftci, N. S. et al., Reversible, Metastable, Ultrafast Photoinduced Electron Transfer From Semiconducting Polymers to Buckminsterfullerene and in the Corresponding Donor/Acceptor Heterojunctions, International Journal of Modern Physics B, 1994, 237–274, 8 (3), World Scientific Publishing Company.

Kraabel, B. et al., Ultrafast photoinduced electron transfer in conducting polymer–buckminsterfullerene composites, Chemical Physics Letters, Oct. 8, 1993, 389–394, 213 (3,4), Elsevier Science Publishers, B.V.

Kraabel, B. et al., Ultrafast spectroscopic studies of photoinduced electron transfer from semiconducting polymers to $C_{60}$ Physical Review B, Dec. 15, 1994, 18 543–18 552, 50 (24), The American Physical Society.

Chamberlain, G. A. et al., Organic Solar Cells: A Review, Solar Cells, 1983, 47–83, 8, Elsevier Sequoia, The Netherlands.

Lee, C. H. et al., Sensitization of the photoconductivity of conducting polymers by $C_{60}$–Photoinduced electron transfer, Physical Review B, Nov. 15, 1993, 15 425–15 433, 48 (20) The American Physical Society.

Yu, G., Polymer Photovoltaic Cells: Enhanced Efficiencies via a Network of Internal Donor–Acceptor Heterojunctions, Science, Dec. 15, 1995, 1789–1791, 270.

Yu, G. et al., Charge separation and photovoltaic conversion in polymer composites with internal donor/receptor heterojunctions, J. Appl. Phys., Oct. 1, 1995, 4510–4515, 78 (70), American Institute of Physics.

Sze, S. M., Chapter 12 LED and Semiconductor Lasers, Physics of Semiconductor Devices, Part V Photonic Devices, 681–838, John Wiley & Sons.

Gustafsson, G. et al., Flexible light–emitting diodes made from soluble conducting polymers, Nature, Jun. 11, 1992, 477–479, 357.

Heeger, Alan J. et al., Optics & Photonics News Aug. 1996, 24–30.

Sariciftci, N. S. et al., Semiconducting polymer–buckminsterfullerene heterojunctions: Diodes, photodiodes, and photovoltaic cells, Appl. Phys. Lett., Feb. 8, 1993, 585–587, 62 (6), American Institute of Physics.

* cited by examiner

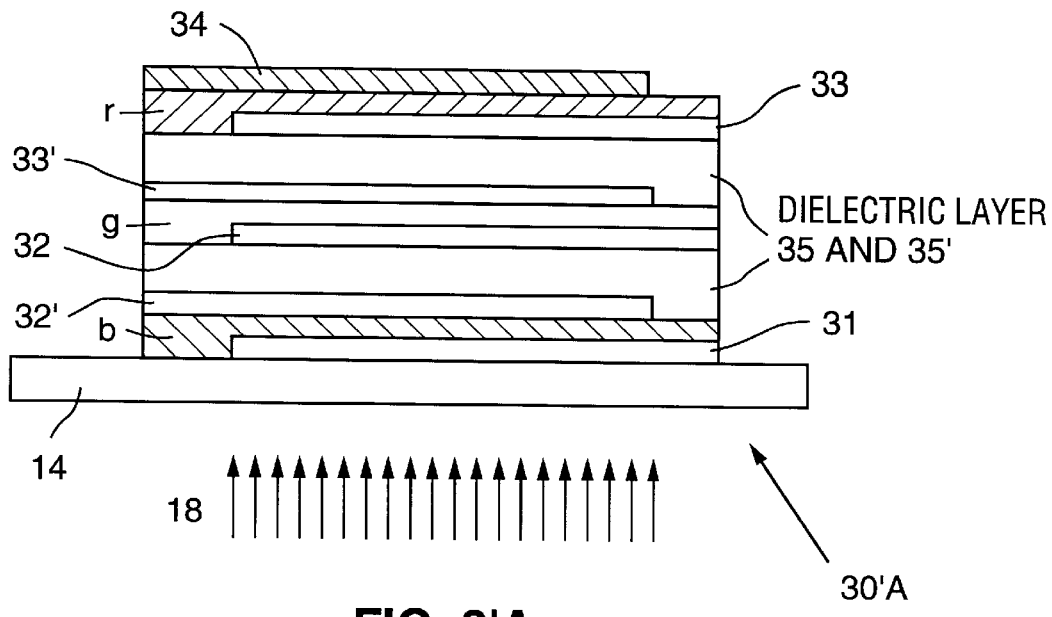
FIG. 3'A
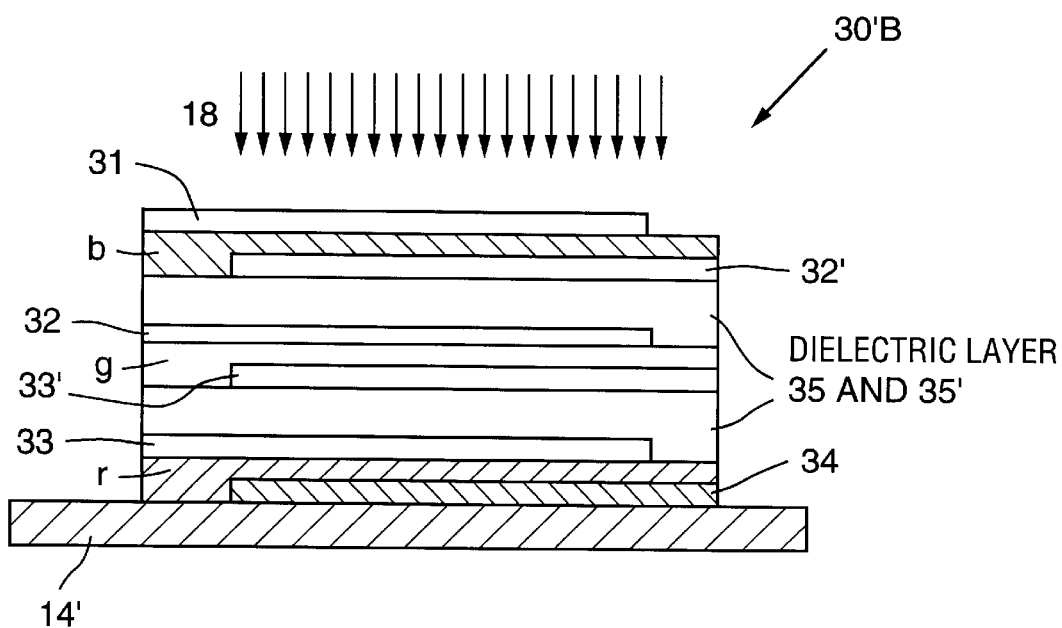
FIG. 3'B

IMAGE SENSORS MADE FROM ORGANIC SEMICONDUCTORS

CROSS-REFERENCE TO RELATED APPLICATIONS

This application claims the benefit of U.S. Provisional Application No. 60/073,347, filed Feb. 2, 1998, which application is incorporated herein by reference in its entirety.

STATEMENT REGARDING FEDERALLY-SPONSORED RESEARCH AND DEVELOPMENT

This invention was made partially with Government support under Grant No. N00421-97-C-1075 awarded by the Department of Defense. The Government has certain rights to this invention.

BACKGROUND OF THE INVENTION

1. Field of the Invention

This invention relates to solid state imaging elements useful in electronic cameras and other related applications. It provides a class of high sensitivity image sensing elements which are assembled into arrays for monochromatic or full-color image sensing devices. These image elements are made of a thin layer (or several layers) of organic semiconductor sandwiched between two conductive electrodes having different or similar work functions. The image signal can be probed by a circuit connected with the two electrodes. The spectral response of the image sensors can be modified and adjusted to desired spectral profiles through material selection, through device thickness adjustment and/or through optical filtering. Several approaches for achieving red, green, and blue color detection or multiple color detection in other desired spectral ranges are disclosed. These sensing elements can be integrated or hybridized with other electronic or optical devices.

2. State of the Art

Several types of image sensor devices have been developed based upon opto-electronic effects in solid state materials. Examples include charge-coupled devices (CCDs), active photosensor arrays made with CMOS technology, and large size image sensors made by combining a matrix of amorphous silicon photocells and a matrix of thin field effect transistors, TFTs, [R. A. Street, J. Wu, R. Weisfield, S. E. Nelson and P. Nylen, Spring Mecting of Materials Research Society, San Francisco, April 17–21 (1995); J. Yorkston et al., Mat. Res. Soc. Sym. Proc. 116, 258 (1992); R. A. Street, Bulletin of Materials Research Society 11(17), (1992); L. E. Antonuk and R. A. Street, U.S. Pat. No. 5,262,649 (1993); R. A. Street, U.S. Pat. No 5,164,809 (1992)]. CCDs are integrating devices.; the accumulated charges generated by incident light intensity are sequentially passed to the end of each row of pixels. This operation mechanism places rigorous demands on material quality and processing conditions. These requirements make CCD arrays costly (~$10³–10⁴ for a CCD camera with dimensions of 0.75@–1@) and thus limit commercial CCDs to sub-inch dimensions.

Recently, research and development on active-pixel photosensors with CMOS technology on silicon wafers were re-activated following advances of this technology to sub-micron resolution [For a review of recent progress, see: Eric J. Lerner, Laser Focus World 32(12) 54, 1996]. The CMOS technology allows the photocells to be integrated with both the driver and the timing circuits so that a mono-chip image camera can be realized. However, even with the state-of-art CMOS technologies (<0.3 μm resolution), there is still limited space (typically much less than 50% of the pixel area) available for the photocells. Most of the pixel area is occupied by the necessary electronic components (field effect transistors etc) of the driving circuit. The same problem also limits the active TFT matrices designed to be used for high pixel density (>100 dpi) image sensing applications. To improve the fill factor (the ratio of sensor area/pitch area) to close to 100%, high sensitivity, processable, thin film photosensor arrays (each sensor is often referred to as an image element) are desired such that each element of said array can be hybridized on top of the driver pixels made by CMOS technology or TFT technology.

Photodiodes made with organic semiconductors are promising candidates for such applications. Although there were early reports, in the 1980s, of fabricating diodes with organic molecules and conjugated polymers, relatively small photoresponse was observed [for a review of early work on organic photodiodes, see: G. A. Chamberlain, Solar Cells 8, 47 (1983)]. In the 1990s, there has been progress using conjugated polymers as the photosensing materials; see for example the following reports on the photoresponse in poly(phenylenevinylene), PPV, and its derivatives: S. Karg, W. Riess, V. Dyakonov, M. Schwoerer, Synth. Metals 54, 427 (1993); H. Antoniadis, B. R. Hsieh, M. A. Abkowitz, S. A. Jenekhe, M. Stolka, Synth. Metals 64, 265 (1994); G. Yu, C. Zhang, A. J. Heeger, Appl. Phys. Lett. 64, 1540 (1994); R. N. Marks, J. J. M. Halls, D. D. D. C. Bradley, R. H. Fricld, A. B. Holmes, J. Phys.: Condens. Matter 6, 1379 (1994); A. J. Heeger and G. Yu, U.S. Pat. No. 5,504,323 (April, 1996); R. H. Friend, A. B. Homes, D. D. C. Bradley, R. N. Marks, U.S. Pat. No. 5,523,555 (June, 1996).

Recent progress demonstrated that the photosensitivity in organic photodiodes can be enhanced under reverse bias; ~90 mA/Watt was observed in ITO/MEH-PPV/Ca thin film devices at 10 V reverse bias (430 nm), corresponding to a quantum efficiency of >20% el/ph [G. Yu, C. Zhang and A. J. Heeger, Appl. Phys. Lett. 64, 1540 (1994); A. J. Heeger and G. Yu, U.S. Pat. No. 5,504,323 (Apr. 2, 1996)]. In photodiodes fabricated with poly(3-octyl thiophene), photosensitivity greater than 0.3 A/Watt was observed over most of visible spectral range under –15 V bias with quantum efficiency over 80% cl/ph in the blue spectral region [G. Yu, H. Pakbaz and A. J. Heeger, Appl. Phys. Lett. 64, 3422 (1994)].

The photosensitivity in organic semiconductors at low bias fields can be enhanced by excited-state charge transfer; for example, by sensitizing the semiconducting polymer with acceptors such as $C_{60}$ or its derivatives [N. S. Sariciftci and A. J. Heeger, U.S. Pat. 5,331,183 (Jul. 19, 1994); N. S. Sariciftci and A. J. Heeger, U.S. Pat. 5,454,880 (Oct. 3, 1995); N. S. Sariciftci, L. Smilowitz, A. J. Heeger and F. Wudl, Science 258, 1474 (1992); L. Smilowitz, N. S. Sariciftci, R. Wu, C. Gettinger, A. J. Heeger and F. Wudl, Phys. Rev. B 47, 13835 (1993); N. S. Sariciftci and A. J. Heeger, Intern. J. Mod. Phys. B 8, 237 (1994)]. Photoinduced charge transfer prevents early time recombination and stabilizes the charge separation, thereby enhancing the carrier quantum yield for subsequent collection [B. Kraabcl, C. H. Lee, D. McBranch, D. Moses, N. S. Sariciftci and A. J. Heeger, Chem. Phys. Lett. 213, 389 (1993); N. S. Sariciftci, D. Braun, C. Zhlang and A. J. Heeger, Appl. Phys. Letters 62, 585 (1993); B. Kraabel, D. McBranch, N. S. Sariciftci, D. Moses and A. J. Heeger, Phys. Rev. B 50, 18543 (1994); C. H. Lee, G. Yu, D. Moses, K. Pakbaz, C. Zhang, N. S. Sariciftci, A. J. Heeger and F. Wudl, Phys. Rev. B. 48, 15425 (1993)]. By using charge transfer blends as the photosensitive material in photodiodes, external photosensitivitics of 0.2–0.3 A/W and external quantum yields of 50–80% el/ph have been achieved at 430 nm at only 2 V reverse bias [G. Yu, J. Gao, J. C. Hummelen, F. Wudl and A. J. Heeger, Science 270, 1789 (1995); G. Yu and A. J. Heeger, J. Appl. Phys. 78, 4510 (1995). At the same wavelength, the photosensitivity of the UV-enhanced silicon photodiodes is ~0.2 A/Watt, independent of bias voltage [S. M. Sze, Physics of Semiconductor Devices (Wiley, N.Y., 1981) Part 5]. Thus, the photosensitivity of thin film photodiodes made with polymer charge transfer blends is comparable to that of photodiodes made with inorganic semiconductor crystals. In addition to their high photosensitivity, these organic photodiodes show large dynamic range; relatively flat photosensitivity has been reported from 100 $mW/cm^2$ down to $nW/cm^2$; i.e., over eight orders of magnitude [G. Yu, H. Pakbaz and A. J. Heeger, Appl. Phys. Lett. 64, 3422 (1994); G. Yu, J. Gao, J. C. Hummelen, F. Wudl and A. J. Heeger, Science 270, 1789 (1995); G. Yu and A. J. Heeger, J. Appl. Phys. 78, 4510 (1995)]. The dynamic range is, again, comparable to that of photodiodes made with inorganic semiconductors. Polymer photodetectors can be operated at room temperature, and the photosensitivity is relatively insensitive to the operating temperature [G. Yu, K. Pakbaz and A. J. Heeger, Appl. Phys. Lett. 64, 3422 (1994)].

As in the case for polymer light emitting devices [G. Gustafsson, Y. Cao, G. M. Treacy, F. Klavetter, N. Colaneri, and A. J. Heeger, Nature 357, 477 (1992); A. J. Heeger and J. Long, Optics & Photonics News, Aug. 1996, p.24], high sensitivity polymer photodetectors can be fabricated in large areas by processing from solution at room temperature, they can be made in unusual shapes (e.g., on a hemisphere to couple with an optical component or an optical system), or they can be made in flexible or foldable forms. The processing advantages also enable one to fabricate the photosensors directly onto optical fibers. Similarly, polymer photodiodes can be hybridized with optical devices or electronic devices, such as integrated circuits on silicon wafers. These unique features make polymer photodiodes attractive for many novel applications.

In image sensing devices made with inorganic semiconductors, the photosensing layer must be pixelated to prevent the photoinduced charges from dispersing along the horizontal direction. Due to the relatively low carrier mobility in the organic semiconductors, the patterning of the photosensing layer becomes unnecessary in most image sensing applications, thereby simplifying the fabrication process significantly.

SUMMARY OF THE INVENTION

This invention discloses several configurations for single color and multiple-color image sensing elements using organic photosensors. These image elements are made of a thin layer (or multiple layers) of organic semiconductors sandwiched between two conductive electrodes. The image signal is probed by a circuit connected to the electrodes. These image sensors can be integrated or hybridized with electronic or optical devices on the same substrate or on different substrates. The spectral response of the image sensing elements can be modified and adjusted to desired special profiles through material selection, through device thickness adjustment and/or through optical filtering. Several approaches for achieving red, green, and blue multi-color detection are disclosed. These methodologies are also suitable for achieving multiple-color selective detection (wavelength multiplexing) and achieving detection in desired spectral ranges ranging from UV through IR.

This invention provides organic photosensors with electrode/organic/electrode sandwich structures for use as sensing elements of pixelated photosensors, particularly capable of detection of incident light with multiple spectral bands.

In another aspect, the invention provides full color image elements comprising red, green and blue sub-pixels (or sub-pixels with their complementary colors, cyan, magenta and yellow) fabricated in the configuration shown in FIGS. 2 through 7.

These sensors can provide multi-band photosensors and sensing pixel elements with desired photoresponse in different spectral ranges including IR, visual, and UV. In the photon or image sensors, the photoactive sensing layer between two contact electrodes can be organic molecules, organometallic molecules, semiconducting polymers, conjugated polymers or blends containing the materials mentioned above in single or multilayer forms.

Conducting electrodes can comprise doped inorganic semiconductors or doped semiconducting compounds and the like and also can include buffer layer(s) inserted at one or more clectrode/organic interfaces. Buffer layers can include conducting polymers, thin layer of organic or organometallic molecules, and inorganic compounds, such as LiF, NaF, BaO, $Li_2O$, $Na_2O$, other metal-florets, metal-oxides and metal-sulfites, metals or metal alloys. The image sensors optical mirrors with the electrodes sandwiching the organic photosensing layer. The mirror/organic layer/mirror forms a microcavity and possesses selective response at resonance wavelengths. In a preferred configuration, two dielectric layers with different dielectric constants can be arranged in alternating fashion to form a DBR mirror. When the two contact electrodes function as optical mirrors. The electrode facing the incident light is relatively thin so that part of the light can pass through it. The metal/organic layer/metal forms a microcavity device (optical etalon), and possesses selective response at resonance wavelengths. The full-color image pixels or structures can be formed with microcavity sensing sub-pixels in both stacking structures (similar to FIGS. 3, 3', 4) or planar structures sensing wavelength at red, green and blue spectral ranges. In another aspect, the image sensor elements supporting substrate which is an optical device.

The image sensor elements of the invention can also support a substrate which comprises switching circuits hybridized with each sensing pixel. These switching circuits can comprise metal-oxide-semiconductor type thin film transistors. Examples of the semiconductors include crystalline silicon, polycrystalline silicon, amorphous silicon, anthracene and its derivatives, pentacene and its derivatives, oligomer thiophene and P3ATs. The supporting substrate can also include large scale integrated circuits for column-row selection and for signal read-out.

The invention also provides a pixelated photodetector in which at least one or all of its sensing elements are constructed as described. The photodetectors can have a common electrode shared by at least a portion of the photosensors in the array. They can be responsive to at least two different wavelengths in the visible spectrum and can have an enhanced pixel density by having at least two different sensors layered upon each other in accord with the stacking structures shown in FIG. 3, 3', or 4. These photodetector arrays and matrices can have a coating of black matrix in the space between sensing pixels is placed in front of the sensor panel. The photodectector arrays can include wavelength selection means wherein each (or a portion) of the pixels response to the incident light at different spectral region.

The wavelength selection means can include interfering filters, dielectric stacks, optical microcavities (etalons), or liquid crystal filters. The sensing pixels comprise mirror/photoactive layer/mirror structures disclosed in this invention. Each sensing pixels possess narrow-band response at different wavelengths. The sensors can include comprising wavelength-selective, narrow band optical filters, such as liquid crystal filters, wherein the center wavelength(s) of the optical filter(s) is(are) tunable by certain mechanisms such as biasing voltage, pressure etc.

BRIEF DESCRIPTION OF THE DRAWINGS

This invention will be further described with reference being made to the drawings in which

FIG. 3'A shows the cross-sectional structure of a full-color image element (30'A) comprised of red, green and blue organic sensors in a stack configuration similar to that shown in FIG. 3A but with dielectric layers separating each of the different color sensors;

FIG. 3'B shows the cross-sectional structure of a full-color image element (30'B) in the reversed structure relative to that of FIG. 3'A;

DETAILED DESCRIPTION OF THE INVENTION

Definitions

Figure 1A:
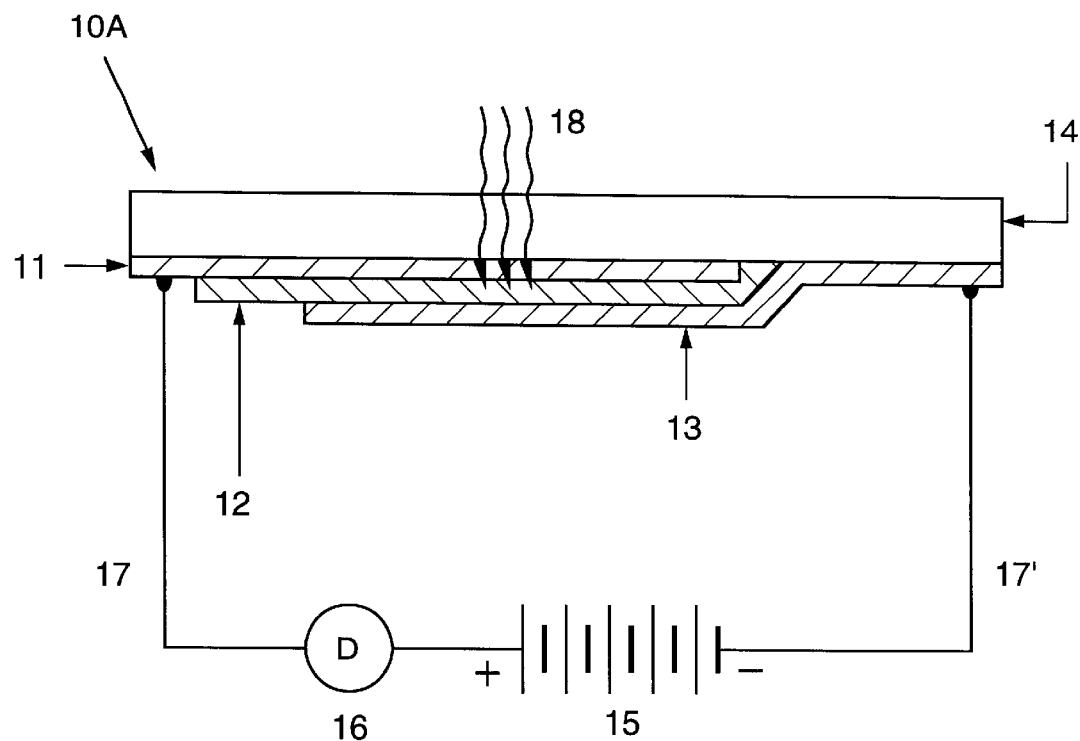
FIG. 1A is a cross-sectional view of a single-color image element (10A) made with an organic photodiode assembled into a circuit. The photocurrent can be read out by an current meter or other read-out circuit (16) inserted in the loop.

In this description of preferred embodiments and in the claims, reference will be made to several terms which must be defined. One group of terms concerns the structures of the image elements. Cross-sectional views of two embodiments of the image sensing elements made with organic semiconductors arc shown in FIG. 1. The image sensing element (10A and 10B and 10') is constructed using the metal-semiconductor-metal (M-S-M) thin film device configuration. Specifically, the device 10A includes:

- A "photoactive layer" (layer 12) comprised of organic, semiconiducting material(s), such as a conjugated polymer, a polymer blend, a polymer/molecule polyblend, a layer of organic molecules, organometallic molecules or molecular blends; or a multilayer structure combining the above materials. These materials are described in more detail below;
- Two "contact electrodes" (layers 11, 13) which serve as the anode and cathode of the photodiodes to extract electrons and holes, respectively, from the photoactive layer. At least one of the electrodes (e.g., layer 11 in FIG. 1A) is made transparent or semitransparent to allow the incident light 18 to be absorbed in the active layer (12). These electrodes are described in more detail below.

The anode electrode is defined as a conducting material with higher work function than the cathode material.

The devices may also include an optional substrate or support 14, as shown in FIG. 1. This is a solid, rigid or flexible layer designed to provide robustness to the photosensors and/or to the matrix array of the image elements. When light is incident from the substrate side, the substrate should be transparent or semitransparent at the wavelengths of operation. Glass quartz, polymer sheets, or flexible plastic films are commonly used substrates. Wide band semiconductor wafers (such as SiC, SiN) which are transparent for photon energies less than their optical energy gaps can also be used in some applications. In these cases, a thin, doped region can also serve as the contact electrode 11.

Figure 1B:
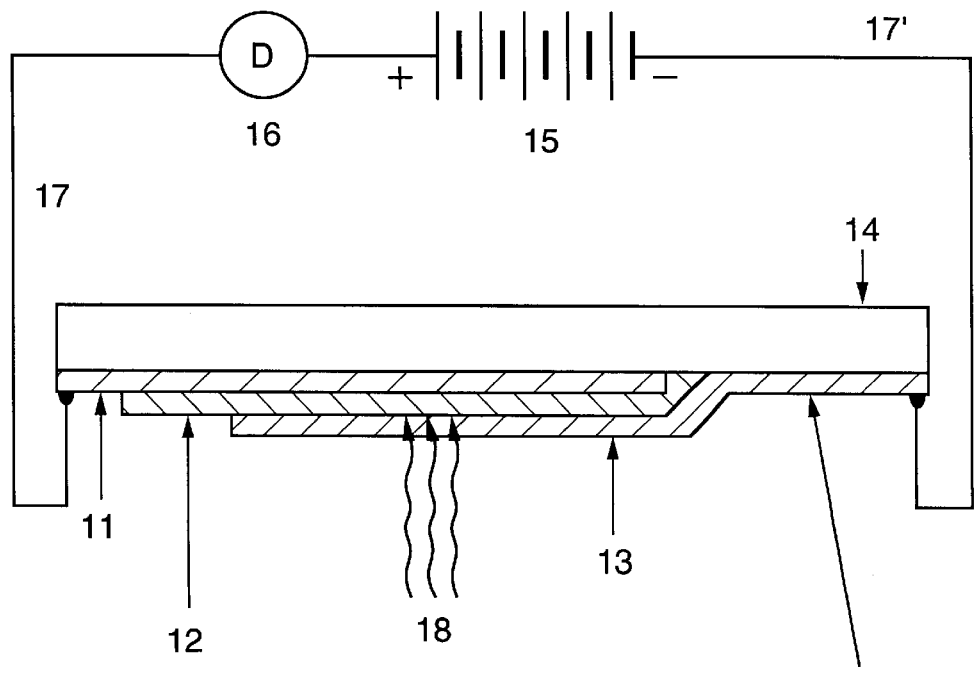
FIG. 1B is a cross-sectional view of a single-color image element (10B) in the so-called reversed configuration wherein the transparent electrode is in contact with the free surface of the active layer.

Devices with the "inverted" geometry shown in FIG. 1B are also useful In this configuration, light is incident through the electrode 13 in contact with the free surface; thus, optically opaque materials can be used as substrates. For example, by using an inorganic semiconductor wafer (such as silicon) as the substrate 14, and by doping the semiconductor to "conductive" levels (as defined in the following), the wafer can serve both as the substrate 14 and the contact electrode 11. The inverted structure offers the advantage of integrating the photosensor with driving/read-out circuitry built directly onto the inorganic semiconductor substrate (using integrated circuit technology).

The incident light 18 is defined generally to include wavelengths in visible (400–700 nm), wavelengths in the ultraviolet (200–400 nm), wavelengths in vacuum ultraviolet (<200 nm), and wavelengths in the near infrared (700–2500 nm).

Several layers are designated as transparent or semitransparent. These terms are used to refer to the property of a material which transmits a substantial portion of the incident light incident on it. The term "transparent" is often used to describe a substrate with transmittance over 20% and the term "semitransparent" is often used to describe a substrate or layer with transmittance between 20% and 1%.

A "conductive" layer or material has a conductivity typically larger than 0.1 S/cm. A semiconducting material has conductivity of from $10^{-14}$ to $10^{-1}$ S/cm.

A 'dielectric' or an 'insulating' layer of material has a conductivity typically lower than $10^{-10}$ S/cm.

The "positive" (or "negative") bias refers to situations where a higher potential is applied to the anode electrode (cathode electrode). When values of negative voltage are referred to, as in the case of the reverse bias voltages applied to obtain enhanced photosensitivity, the relative values will be stated in terms of absolute values; that is, for example, a −10 V (reverse) bias is greater than a −5 V (reverse) bias.

The spectral response of the image sensing elements is determined by the optical band gap and the electronic properties (such as carrier mobility) of the sensing material, by the structure of the sensing elements and by the transmission characteristics of the optical filters, substrates, or other coating layers in the optical path; as demonstrated in the examples in this application.

In addition to single band, visible image detection (often referred as black/white, or monochromatic image sensors), there is great demand for image sensors with full-color detectivity. Full-color detection is often achieved by splitting the visible spectrum into three separate regions, the red (600–700 nm), green (500–600 nm) and blue (400–500 nm) fundamental colors. A full-color signal can be represented by the intensities of the incident light in these three bands. A full-color image element thus refers to an image device with three spectral channels in the red, green and blue spectral ranges (sometimes, their complimentary colors, cyan, magenta and yellow, are chosen), and can provide correct color and light intensity information on the incident light.

A coating of "black" material (opaque in the spectral range of interest) in the area between each sensing pixel can be placed in front of the photodetector plane, foiming a "black matrix". This coating is helpful in some situations to further reduce cross-talk between neighbor pixels in devices with an unpattenied photoactive organic layer. Black matrices have been used in CRT monitors and other flat panel displays to increase display contrast, and are well known in the display industry. The patterning of the "black matrix" can be achieved with standard photolithography, stamp, ink-jet or screen printing techniques.

Materials

The Photoactive Layer

The photoactive layer is made of a thin sheet of organic semiconducting material. The active layer can comprise one or more semiconducting, conjugated polymers, alone or in combination with non-conjugated materials, one or more organic molecules, or oligomers. The active layer can be a blend of two or more conjugated polymers with similar or different electron affinities and different electronic energy gaps. The active layer can be a blend of two or more organic molecules with similar or different electron affinities and different electronic energy gaps. The active layer can be a blend of conjugated polymers and organic molecules with similar or different electron affinities and different energy gaps. The latter offers specific advantages in that the different electron affinities of the components can lead to photoinduced charge transfer and charge separation; a phenomenon which enhances the photosensitivity [N. S. Sariciftci and A. J. Heeger, U.S. Pat. No. 5,333,183 (Jul. 19, 1994); N. S. Sariciftci and A. J. Heeger, U.S. Pat. No. 5,454,880 (Oct. 3, 1995); N. S. Sariciftci, L. Smilowitz, A. J. Heeger and F. Wudl, Science 258, 1474 (1992); L. Smilowitz, N. S. Sariciftci, R. Wu, C. Gettinger, A. J. Heeger and F. Wudl, Phys. Rev. B 47, 13835 (1993); N. S. Sariciftci and A. J. Heeger, Intern. J. Mod. Phys. B 8,237 (1994)]. The active layer can also be a series of heterojunctions utilizing layers of organic materials or blends as indicated above.

The onset of photoresponse is related with the optical absorption gap in the organic film. One advantage of the organic semiconductors is their relative ease in bandgap engineering. The bandgap of conjugated polymers or short-chain-length oligamers is related to the molecular structure of its repeat unit on its main chain. For instance, poly(p-phenelene) PPP or six-phenyl 6P has an optical band gap of 400 nm. Inserting a vinylene unit in between each phenylene ring forms poly(phenylene vinylene) PPV or oligomer-PV and shifts the bandgap to ~500 nm. Replacing the benzene ring with a thiophene ring forms polythiophene and shifts the optical bandgap to ~630 nm. Inserting the vinylene unit in between each thiophene ring forms poly(thienylene vinylene) PTV and shifts the bandgap to ~700 nm.

For polymers and oligomers with a given main chain, the optical bandgap can also be tuned by attaching different molecular group(s) on to side chains. Taking PPV as an example, the optical gap is at ~500 nm for regular PPV without side chains, or for a PPV with alkyl side chains.

They are useful for fabricating blue pixels. By attaching alkoxy side chains onto the benzene rings (for instance at 2,6 positions) of PPV, the optical gap shifts to ~600 nm. These molecules are good materials for fabricating green pixels. Attaching cyano groups on each of the vinyl unit of the PPV chain forms CN-PPV and shifts the optical gap to ~700 nm. CN-PPV is a good material for fabricating red pixels. The practice of shifting the energy gap by side chain engineering is effective not only to PPV system, but effective generally to all the semiconducting organic molecules.

As is well known, the processability of organic molecules can also be adjusted by side chain engineering. With properly designed side chains, one can obtain a set of organic molecules with the desired photosensitive response for red, green and blue pixels, and also provide process compatibility needed for the color pixel fabrication.

The thin films of organic molecules, oligomers and molecular blends can be fabricated with thermal evaporation, chemical vapor deposition (CVD) and so on. Thin films of conjugated polymers, polymer/polymer blends, polymer/oligomer and polymer/molecule blends can often be fabricated by casting directly from solution in common solvents or using similar fluid phase processing. When polymers or polyblends arc used as the active layer, the devices can be fabricated onto flexible substrates yielding unique, mechanically flexible photosensors.

Examples of typical semiconducting conjugated polymers include, but are not limited to, polyacetylene, ("PA"), and its derivatives; polyisothianaphlene and its derivatives; polythiophene, ("PT"), and its derivatives; polypyrrole, ("PPr"), and its derivatives; poly(2,5-thienylenevinylene), ("PTV"), and its derivatives; poly(pphenylene), ("PPP"), and its derivatives; polyflourene, ("PF"), and its derivatives; poly(phenylene vinylene), ("PPV"), and its derivatives; polycarbazole and its derivatives; poly(1,6-heptadiyne); polyisothianaphene and its derivatives; polyquinolene and semiconducting polyanilines (i.e. leucoemeraldine and/or the emeraldine base form). Representative polyaniline materials are described in U.S. Pat. No. 5,196,144 which is incorporated herein by reference. Of these materials, those which exhibit solubility in organic solvents are preferred because of their processing advantages.

Examples of PPV derivatives which are soluble in common organic solvents include poly(2-methoxy-5-(2'-ethyl-hexyloxy)-1,4-phenylene vinylene), ("MEH-PPV") [F. Wudl, P.-M. Allemand, G. Srdanov, Z. Ni and D. McBranch, in Materials for Nonlinear Optics: Chemical Perspectives, edited by S. R. Marder, J. E. Sohn and G. D. Stucky (The American Chemical Society, Washington D.C., 1991), p. 683.], poly(2-butyl-5-(2-ethyl-hexyl)-1,4-phenylenevinylene), ("BuEH-PPV") [M. A. Andersson, G. Yu, A. J. Heeger, Synth. Metals 85, 1275 (1997)], poly(2,5-bis(cholestanoxy)-1,4-phenylenevinylene), ("BCHA-PPV") [see U.S. patent application Ser. No. 07/800,555, incorporated herein by reference] and the like. Examples of soluble PTs include poly(3-alkylthiophenes), ("P3AT"), wherein the alkyl side chains contain more than 4 carbons, such as from 5 to 30 carbons.

Organic image sensors can be fabricated using donor/acceptor polyblends as the photoactive layer. These polyblends can be blends of semiconducting polymer/polymer, or blends of semiconducting polymer with suitable organic molecules and/or organometallic molecules. Examples for the donor of the donor/acceptor polyblends include but are not limited to the conjugated polymers just mentioned, that is PPV, PT, PTV, and poly(phenylene), and their soluble derivatives. Examples for the acceptors of the donor/acceptor polyblends include but are not limited to poly (cyanophenylenevinylene) ("CN-PPV"), fullerene molecules such as $C_{60}$ and its functional derivatives, and organic molecules and organometallic molecules used heretofore in the art for photoreceptors or electron transport layers.

One can also produce photoactive layers using two semiconducting organic layers in a donor/acceptor heterojunction (i.e., bilayer) structure or alternation layer structures. In these structures, the donor layer is typically a conjugated polymer layer and the acceptor layer is made up of poly (cyanaophenylenevinylene) ("CN-PPV"), fullerene molecules such as $C_{60}$ and its functional derivatives (such as PCBM and PCBCR), or organic molecules used heretofore in the art for photoreceptors and electron transport layers. Examples of this heterojunction layer structure for a photoactive layer include but are not limited to, PPV/$C_{60}$, MEH-PPV/$C_{60}$, PT/$C_{60}$, P3AT/$C_{60}$, PTV/$C_{60}$ and so on.

The active layer can also be made of wide band polymers such as poly-N-vinylcarbazole ("PVK") doped with dye molecule(s) to enhance photosensitivity in the visible spectral range. In these cases, the wide band organic serves as both host binder as well as hole (or electron) transport material. Examples include, but are not limited to, PVK/o-chloranil, PVK/rhodamine B and PVK/coronene and the like.

The photoactive layer can employ organic molecules, oligomers or molecular blends. In this embodiment, the photosensitive material can be fabricated into thin films by chemical vapor deposition, molecular epitaxy or other known film-deposition technologies. Examples of suitable materials include but are not limited to anthracene and its derivatives, tetracene and its derivatives, phthalocyanine and its derivatives, pinacyanol and its derivatives, fullerene ("$C_{60}$") and its derivatives, thiophene oligomers (such as sixethiophene "6T" and octithiophene "8T") and their derivatives, phenyl oligomers (such as sixephenyl "6P" or octiphenyl "8P") and their derivatives, aluminum chelate (Alq3) and other metal-chelate molecules (m-q3), PBD, spiro-PBD, oxadiazole and its derivatives and blends such as 6T/$C_{60}$, 6P/$C_{60}$, 6P/PBD, 6P/Alq3, 6T/pinacyanol, phthalocyanine/o-chloranil, anthracene/$C_{60}$, anthracene/o-chloranil. For the photoactive layer containing more than two types of molecules, the organic layer can be in a blend form, in bilayer form or in multiple alternate layer forms.

In some embodiments, the active layer comprises one or more organic additives (which are optically non-active) to modify and to improve the device performance. Examples of the additive molecules include anionic surfactants such as ether sulfates with a common structure, $$R(OCH_2CH_2)_n OSO_3^- M^+$$

wherein R represents alkyl alkyllaryl, $M^+$ represents proton, metal or ammonium counterion, n is moles of ethylene oxide typically n=2–40).

Application of such anionic surfactants as additives for improving the performance of polymer light-emitting diodes has been demonstrated by Y. Cao [U.S. patent application, Ser. No. 08/888,316, which is incorporated by reference].

Other types of additives include solid state electrolytes or organic salts. Examples include poly(ethylene oxide), lithium trifluoromethanesulfonate, or their blends, tetrabutylammonium dodecylbenzenesulfonate and the like. Application of such electrolyte to luminescent polymers and invention of new type of light-emitting devices have been demonstrated in U.S. Pat. Nos. 5,682,043 and 5,677,546.

In cases where the active layer is made of organic blends with two or more phases with different electron affinities and optical energy gaps, nanoscale phase separation commonly occurs, and heterojunctions form at the interfacial area. The phase(s) with higher electron affinity acts as an electron acceptor(s) while the phases with lower electron affinity (or lower ionization energy serves as an electron donor(s). These organic blends form a class of charge-transfer materials, and enable the photo-initiated charge separation process defined by the following steps [N. S. Sariciftci and A. J. Heeger, Intern. J. Mod. Phys. B 8, 237 (1994)]:

Step 1: $D+A''{}^{1,3}D*+A$, (excitation on D);
Step 2: $^{1,3}D*+A''{}^{1,3}(D-A)*$, (excitation delocalized on D-A complex);
Step 3: $^{1,3}(D-A)*''{}^{1,3}(D^{d+}-A^{d-})*$, (charge transfer initiated);
Step 4: $^{1,3}(D^{d+}-A^{d-})*''{}^{1,3}(D^{+\circ}-A^{-\circ})$, (ion radical pair formed);
Step 5: $^{1,3}(D^{+\circ}-A^{-\circ})''D^{+\circ}+A^{-\circ}$, (charge separation) where (D) denotes the organic donor and (A) denotes the organic acceptor; 1,3 denote singlet or triplet excited states, respectively.

Typical thickness of the active layer range from a few hundred Angstrom units to a few thousand Angstrom units; i.e., 100–5000 Å (1 Ångstrom unit=$10^{-8}$ cm). Although the active film thicknesses are not critical, device performance can typically be improved by using thinner films with optical densities of less than two in the spectral region of interest.

Electrodes

In the configuration shown in FIG. 1A, a transparent substrate and a transparent electrode are used as one contact electrode. Indium-tin-oxides ("ITO") can be used as the electrode. Other transparent electrode materials include aluminum doped zinc oxides ("AZO"), aluminum doped tin-oxides ("ATO"), tin-oxides and the like. These conducting coatings are made of doped metal-oxide compounds which are transparent from near UV to mid-infrared.

The electrode can also be made with other doped inorganic compounds or alloys. These compounds can be doped into metallic (or near metallic) form by varying the composition of the elements involved, the valance of the elements or the morphology of the films. These semiconducting or metallic compounds are known in the art and are well documented (e.g., N. F. Mott, Metal-Insulating Transitions, 2nd edition (Taylor & Francis, London, 1990); N. F. Mott and E. A. Davis, Electronic Processes in Non-crystalline Materials (Claredon, Oxford, 1979)]. Examples of such compounds include the cuprate materials which possess superconductivity at low temperatures (so-called high temperature superconductors).

This electrode can be formed of a conductive polymer such as polyaniline in the emeraldine salt form prepared using the counterion-induced processability technology disclosed in U.S. Pat. No. 5,232,631 and in Appl. Phys. Lett. 60, 2711 (1992) or other suitable techniques. The polyaniline film which serves as the electrode can be cast from solution with high uniformity at room temperature. The organic conducting electrodes in combination with polymer substrates and organic active layers allow these photosensors be fabricated in fully flexible form. Other conductive polymers can be used for the transparent or semitransparent electrode (11 in FIG. 1 or 13 in FIG. 2) include polyethylene dioxythiophene polystyrene sulfonate, ("PEDT/PSS") [Y. Cao, G. Yu, C. Zhang, R. Menon and A. J. Heeger, Synth. Metals, 87, 171 (1997)], poly(pyrrole) or its function derivatives doped with dodecylbenzene sulfonic acid ("DBSA") or other acid [J. Gao, A. J. Heeger, J. Y. Lee and C. Y. Kim, Synth. Metals 82, 221 (1996)] and the like.

A thin semitransparent layer of metals (such as Au, Ag, Al, In etc.) can also be used as electrodes. Typical thicknesses for this semitransparent metal electrode are in the range of 50–1000 Å, with optical transmittance between 80% and 1%. A proper dielectric coating (often in the form of multilayer dielectric stacks) can enhance the transparency in the spectral range of interest [For examples, see S. M. Sze, Physics of Semiconductor Devices (John Wiley & Sons, New York, 1981) Chapter 13].

A transparent electrode can also be made from metal/conducting polymer, conducting polymer/metal/conducting polymer or dielectric layer/metal/conducting polymer structures. The transmission properties of these composite electrodes are improved relative to that of a single metal layer of the same thickness.

A metal layer with low optical transmittance can also be used as the electrode for some applications in which spectral response at certain wavelengths is of interest. The photosensitivity can be enhanced by fabricating the device in a micro-cavity structure where the two metal electrodes 11 and 13 act also as optical mirrors. Light resonance between the two electrodes enhances the photosensitivity at certain wavelengths and results in selective spectral response, similar to that seen in optical microcavity (optical etalon) devices.

The "back" electrode 13 in FIG. 1 is typically made of a metal, such as Ca, Sm, Y, Mg, Al, In, Cu, Ag, Au and so on. Metal alloys can also be used as the electrode materials. These metal electrodes can be fabricated by, for example, thermal evaporation, electron beam evaporation, sputtling, chemical vapor deposition, melting process or other technologies. The thickness of the electrode 13 in FIG. 1 (and 11 in FIG. 2) is not critical and can be from hundreds of Ångstroms to hundreds of microns or thicker. The thickness can be controlled to achieve a desired surface conductivity.

When desired, for example for a photodiode with detectivity on both front and back side, the transparent and semi-transparent materials described above can also be used as the "back" electrode.

Device Configuration

Figure 2A:
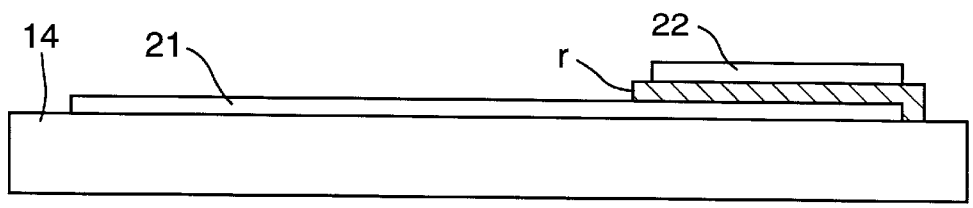
FIG. 2 is a cross-sectional view of a full-color image element comprised of red, green and blue sub-pixels with a common electrode (2D); the fabrication process is shown in FIG. 2A to FIG. 2D. An alternative of this configuration with separated electrode contact is shown in FIG. 2E.
Figure 2B:
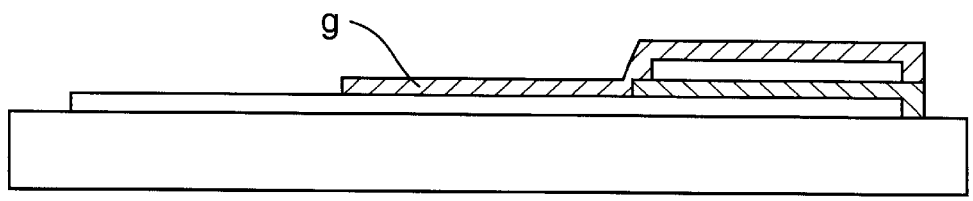
Figure 2C:
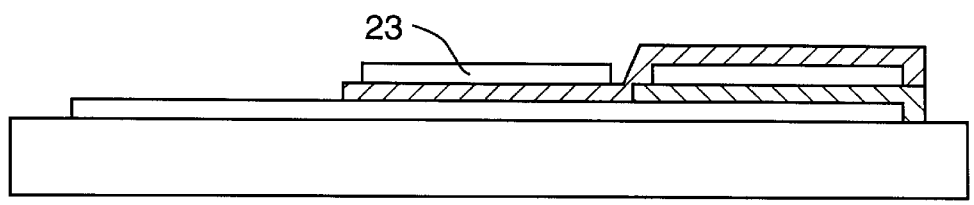
Figure 2D:
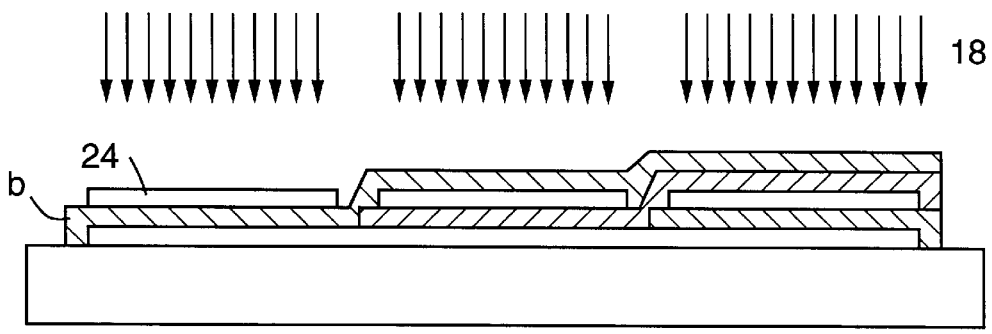

A pair of basic device configurations have been described with reference to FIGS. 1A and 1B. Full-color image elements can be made with organic semiconductors, but without additional optical filters, in the structures shown in FIG. 2. These image elements are constructed with three organic photodetectors, each with a different long wavelength cut-off. These devices can be fabricated on a silicon wafer with a metal electrode or an electrode made with doped silicon. They are thus suitable for hybridization with a readout circuit fabricated on silicon wafer. For the devices made on optically opaque substrates 14, as shown in FIG. 2D, the red sensor pixel is made on top of the electrode (21) with an organic semiconductor film (r) with optical band gap at ~700 nm. A thin, semitransparent metal electrode (22) (or transparent ITO electrode, or transparent conducting polymer electrode) can then be fabricated on the top of the red pixel area. The area of the red polymer is then defined by removing the red sensing film r (for example, by laser ablation or by plasma etching) in the areas reserved for the green and blue pixels (see FIG. 2A). The green sensor is made of an organic semiconducting film (g) with optical absorption gap at ~600 nm. A thin, semitransparent metal layer (23) (or transparent ITO electrode, or transparent conducting polymer electrode) can then be fabricated on the top of the green pixel area. The organic layer for green sensor also acts as the short-wavelength-cut filter for the red sensor (see FIG. 2B). The organic film for green sensor in the blue pixel area is then removed and the blue sensor is fabricated by casting a layer of organic semiconductor film (b) with optical absorption gap at 500 nm. The blue sensor is completed by depositing a metal (or ITO or conducting polymer) layer (24) over the blue pixel area. No patterning is necessary for the organic film for the blue sensor (see FIG. 2D). The electrode materials for each color pixel can be different and can be selected to optimize device performance.

Since the active films for shorter wavelength sensors also act as the short-wavelength-cut filters for the longer wavelength sensors, there is intrinsically little spectral overlap between neighboring color pixels. The full-color sensor can, thus, be made with high color purity following the CIE color standard. The short wavelength cut-off of each sensor pixel can be adjusted in detail by using organic films with different optical gaps and/or by varying the thicknesses of the organic films. An example of a full-color image sensing element made in the configuration of FIG. 2D is provided in Example 9.

Figure 2E:
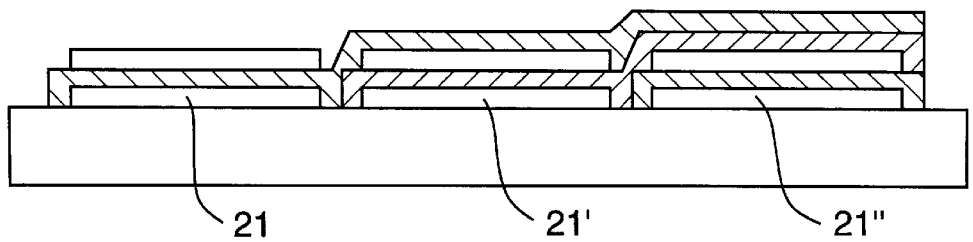

Similar image sensors can be made in the alternative structures shown in FIG. 2E in which electrode 21 is patterned to give a separation between the various pixels. Alternatively, the color sensors can be fabricated with transparent substrates (such as glass or quartz). In this case, the order of the sensor layers is altered to B, G, R (counting from the substrate side) to permit light to enter through the substrate and be sensed by each pixel. In a prefelTed embodiment, the substrate is opaque to UV radiation so that no additional UV cut-off filter is needed.

Figure 3A:
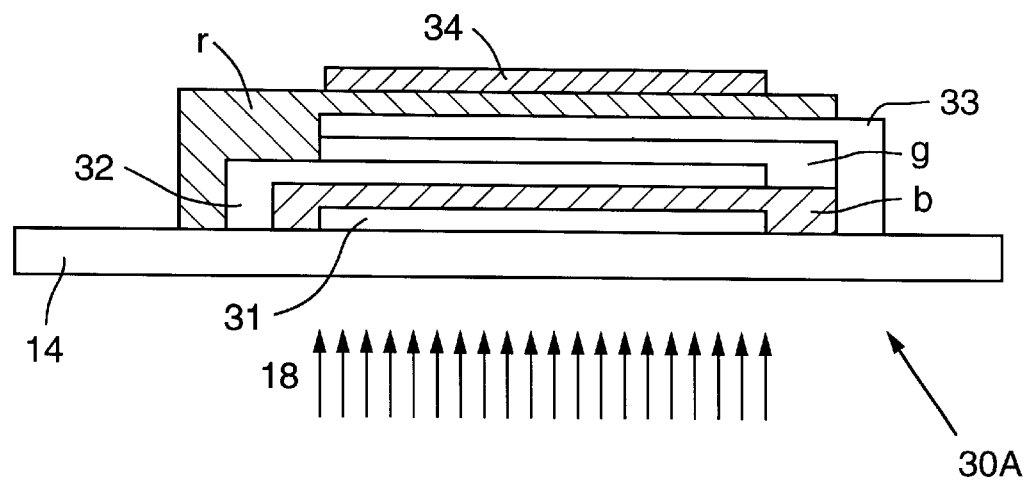
FIG. 3A shows the cross-section structure of a full-color image element (30A) comprised of red, green and blue organic sensors in a stack configuration.

Full-color image sensing elements can also be fabricated in the structures shown in FIG. 3 with red, grecen and blue sensors fabricated in a stack configuration. They are constructed using three organic photodetectors with different long wavelength cut-offs, at 500 nm, 600 nm and 700 nm, similar to the materials discussed above. The device can be fabricated on a transparent substrate 14 (See FIG. 3A) with patterned ITO, conducting polymer, or semitransparent metal electrodes (31). The blue sensor is fabricated with a layer of organic film (b) with photoresponse edge at 500 nm, and coated with a thin, semitransparent metal (Such as Al) electrode as the cathode of the blue sensor (32). The electrode (32) is also used as the cathode of the green sensor. The green sensor is made of an organic semiconducting film (g) with photoresponse edge at ~600 nm. Then a thin, semi-transparent metal, or ITO or conducting polymer anode (33) is deposited. The anode (33), again, serves as the common electrode for the green and red sensors. The red sensor is made of a semiconducting polymer (r) with photoresponse edge at ~700 nm. Finally a metal electrode (34) is deposited on top as the cathode for the red sensor.

The spectral responses of the red, green and blue color pixels are similar to the sensing elements made in the structures shown in FIG. 2. The organic layers used for shorter wavelength sensors also serve as the long wavelength pass (short wavelength cut) filters for the color sensors of longer wavelengths. The spectral responses can also be adjusted by changing sensing material (and thus the optical gap) to match the CIE color standard. Moreover, these three band photosensors are not restricted to the red, green and blue spectral regions. They can be designed to any desired spectral region from UV to infrared.

Figure 3B:
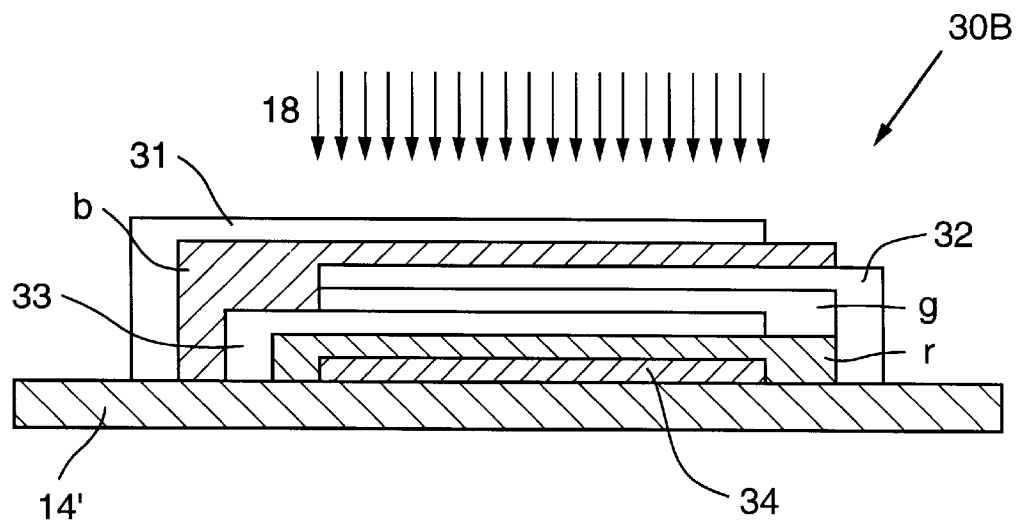
FIG. 3B shows the cross-sectional structure of a full-color image element (30B) in the reversed structure relative to that of FIG. 3A.

Full-color image elements can also be fabricated in the stacked configuration structure with opaque substrates as shown in FIG. 3B. In this case, the stacking order of the color sensors is opposite to that shown in FIG. 3A, with the red sensor close to the substrate. A transparent polymer electrode can be used as the top electrode (31).

Full-color image elements can also be fabricated in the stacked structure shown in FIG. 3', in which the red, green and blue color organic sensors in the stacked configuration similar to that shown in FIG. 3 but with dielectric layers 35 and 35' separating each color sensor. The structures shown in FIG. 3 are useful in circumstances where cross contamination between the organic layers during fabrication becomes a concern or in the cases when electrical isolation between color sensors is needed.

An important advantage of the sensing elements shown in FIGS. 2, 3, and 3' is that no additional optical filters are needed in achieving red, green and blue color sensors. Another advantage for the stacked structures shown in FIGS. 3 and 3' is that the sensing area of the red, green and blue pixel element is equal to the total color pixel size; i.e., the fill-factor (the area of the mono-color subpixel to that of the full-color pixel) is 100%.

Figure 4A:
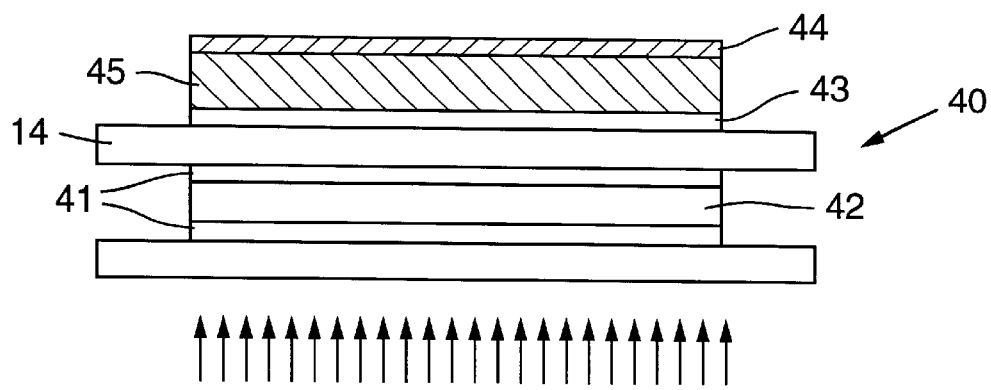
FIG. 4A shows the cross-sectional structure of a full-color image element (40) comprised of a variable-color liquid crystal color filter and a broad band organic photosensor in a stack configuration.
Figure 4B:
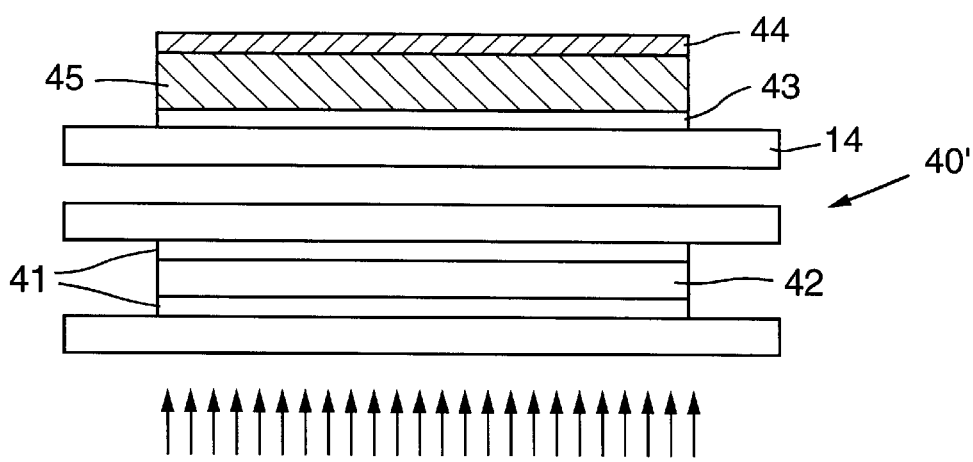
FIGS. 4B and 4C show the cross-sectional structures of two other stack configurations, 40' and 40", for a full-color image element in combination with a liquid crystal color-filter panel.
Figure 4C:
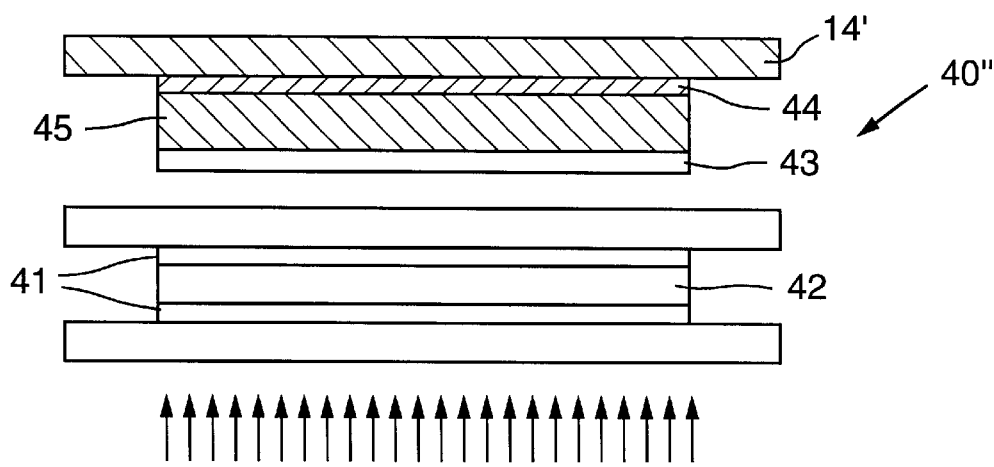

Full-color image elements can also be fabricated by integration of a variable color filter panel with a wide-band organic photosensor 40, as shown in FIG. 4A. Variable-color filters have been developed with liquid-crystal technology [T. J. Scheffer, W. S. U.S. Pat. No. 4,019,808, Apr. 26, 1987; P. J. Bos, U.S. Pat. No. 4,635,051, Jan. 6, 1987; P. J. Bos et al., Mol. Cryst. Liq. Cryst., 113,329 (1984); G. D. Sharp and K. M. Johnson, SPEI Electronic Imaging Conference, Jan. 27–Feb. 2, 1996]. Transmission in red, green and blue color regions can be achieved by variation of the external bias applied between electrode 41 and 42 with transmission profiles in desired wavelength ranges. In FIG. 4A, the substrate 14 of the liquid crystal filter is used in fabrication of the organic photosensor made up of electrodes 43 and 44 and organic sensing layer 45. FIGS. 4B and 4C provide other useful configurations 40' and 40", in which wide-band, photosensor matrices are fabricated on a separate substrate 14 with variable color, liquid crystal filter. In these configurations, the color filter does not have to be pattered into pixelated form. A single filter that covers the entire sensor area can be used. R, G, B color images can be achieved by properly synchronizing the sampling pulse sequences between the sensor matrix and the color filter panel. Another feature of the liquid crystal filter is a shutter function. When the filter is zero biased, no light is passing through the filter. No additional shutter is needed for the image sensors constructed with liquid crystal color filters. Hence, a full-color digital camera can be made with the wide-band, black/white image sensor placed at the focal plan and with the liquid crystal filter placed at the traditional shutter plan. The liquid crystal filter functions as both the shutter and the R,G,B color filters.

Figure 5A:
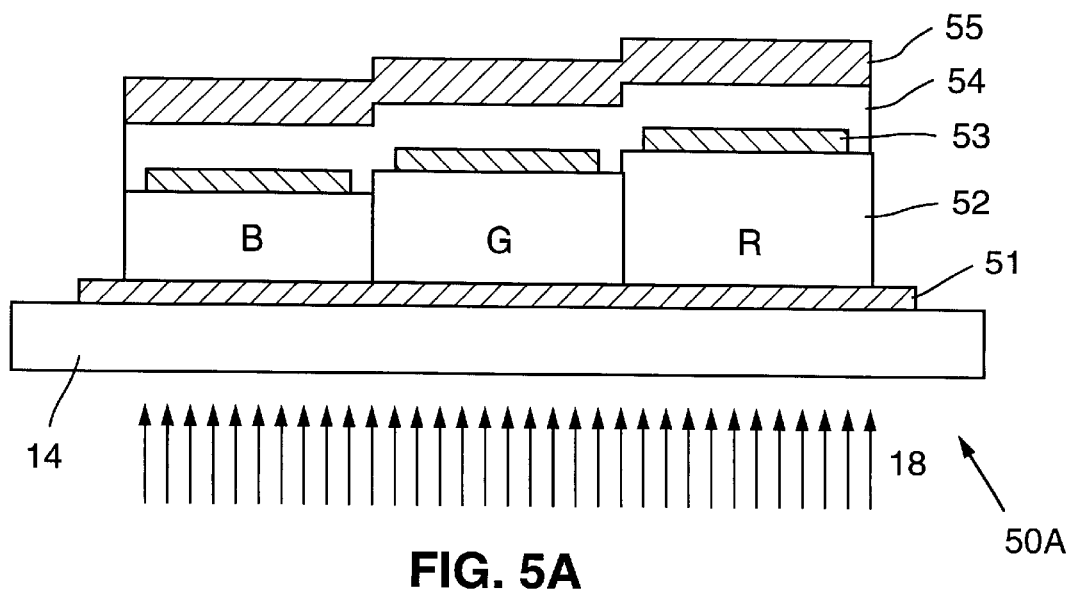
FIG. 5A shows the cross-sectional structure of a full-color image element (50A) comprised of red, green and blue organic sensors, which is constricted with three identical broad band organic photosensors and three optical etalons.
Figure 5B:
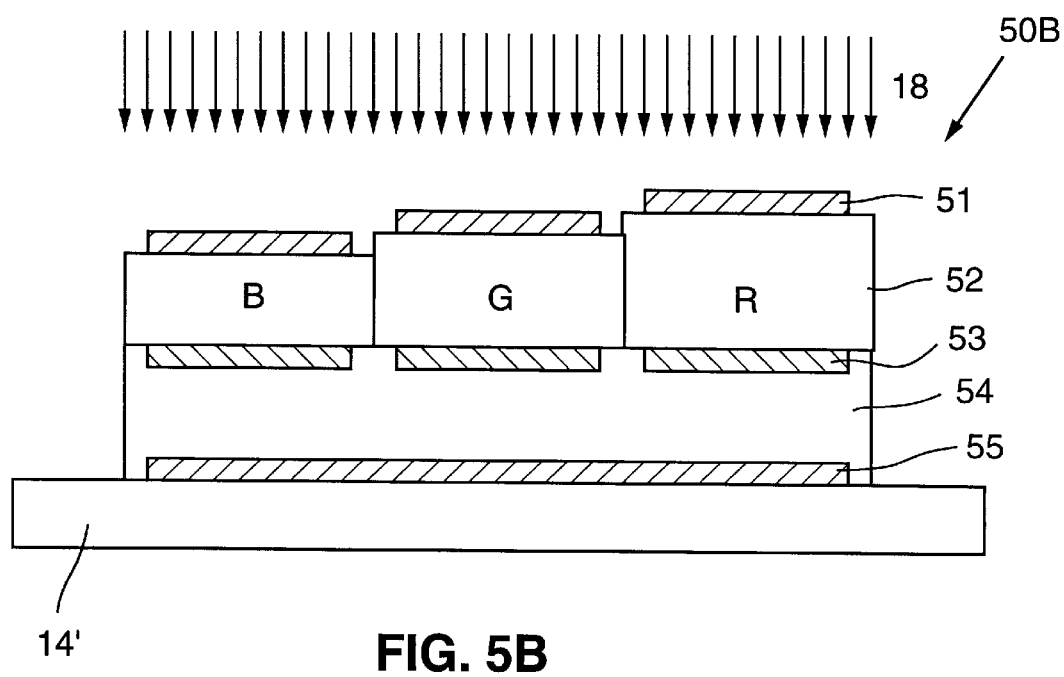
FIG. 5B shows the cross-sectional structure of a full-color image element (50B) in the reversed structure relative to that of FIG. 5A.

Full-color image elements can also be fabricated in the structure 50 shown in FIG. 5. In this case, a broad band organic photosensor is used as the sensing elements for all the color elements. Red, green and blue color selections are achieved by optical etalon devices B, G, R integrated in front of the sensors. The spectral responses of the red, green and blue color pixels are primarily determined by the transmission characteristics of the etalon devices. The bandwidth and the central frequency of the transmission band of the etalon can be adjusted by the thicknesses of the dielectric layer (52) and the metal or dielectric mirror layers (51, 53) to fit the CIE color standard. This method provides full-color image elements with high quality spectral purity. When a metal is used as the mirror layer (53), it serves as both the optical mirror for the etalon and as a contact electrode for the sensor. When the mirror (53) is made of dielectric material, another transparent or semitransparent electrode layer should be added in between 53 and the active organic layer 54. The requirement for the sensing layer is that its photoresponse should cover the entire spectral range of interest. An example of color image elements made in this structure is given in Example 11. Full-color image elements can also be fabricated in the reversed structure shown in FIG. 5B. In this case, an optical opaque substrate (such as silicon wafer) can be used as the substrate material 14.

The etalon type of optical filter allows a metal layer with low optical transmission to be used as the electrode of the sensor. This methodology provides color sensors with lower contact/wiring resistance (~0.1Ω per square for an Au layer of 150 Å), a feature which is especially suitable for high pixel density applications in which low resistance is required for contact electrode and connection.

The etalon type optical filters can also be replaced with dielectric optical filters (such as dielectric stacks or Diffractive Bragg Reflectors, DBR), or other interference filters commonly used in the optical industry.

When the organic photoactive layer is of relatively low absorbance (for instance, a layer of $C_{60}$ or PCBM in the visible spectral region), a photosensor with wavelength selective response in the red, green or blue region can be achieved following the device structures shown in FIG. 1; i.e., by sandwiching the photoactive layer 12 between the two metal electrodes 11 and 13. The two metal electrodes also serve as optical mirrors in addition to being the contact electrodes. The center wavelength and the bandwidth can be adjusted by the thickness of the photoactive layer. This fact allows for fabrication of the red, green and blue pixels with the same organic material.

Again, these multi-color image elements are not restricted to red, green and blue spectral regions and not restricted to three spectral regions. Their spectral responses can be designed to any desired spectral regions from UV to near infrared with specific bandwidth.

When a wavelength-variable, narrow band filter is placed in front of an organic photosensor, the filter/wide band sensor forms a photosensor with spectrographic function. One type of wavelength variable filter is an optical etalon made with a liquid crystal medium sandwiched between two metal flats or two dielectric mirrors with transparent electrodes. When the bias of the liquid crystal changes, the effective optical length changes due to the change in dielectric constant. Hence the resonance wavelength is varied. The liquid crystal can be replaced by other dielectric materials with nonlinear optical properties. Examples include electro-optical crystals traditionally used for electro-optical modulators. Such types of wavelength variable image sensors are of broad interest in spectrographic applications, in optical communications, biophysics and biomedical applications.

Figure 6:
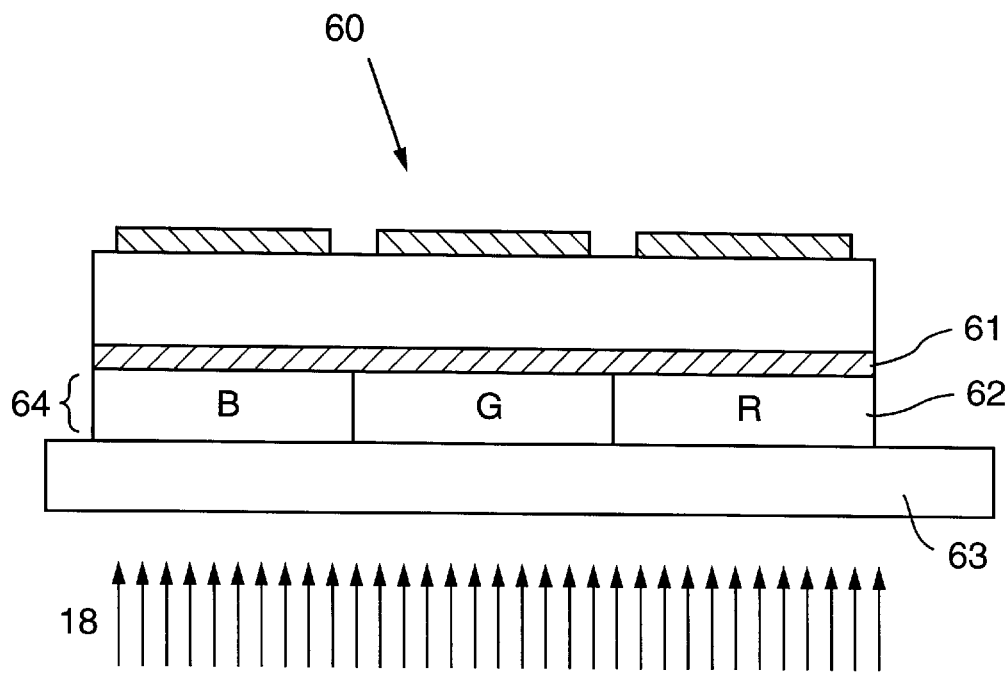
FIG. 6 shows the cross-sectional structure of a full-color image element (60) comprised of red, green and blue sub-pixels, which is made with three identical broad band organic sensors and a color filter/ITO substrate.

Full-color image elements can also be fabricated in the structure shown in FIG. 6 as 60. A broad band photosensor can be used for the sensing elements. Substrate 64 (in the form of ITO (61)/color-filter(62)/glass (63) substrate (63))is used as the electrode with color selection. This type of substrate was developed originally for color LCDs (liquid crystal displays). In this approach, full-color image elements can be fabricated in two steps: polymer coating and counter electrode forming. No patterning of the polymer layer is necessary.

Color filter panels with designed patterns, often in arrangements in square, triangular, striped, or diagonal mosaics, with transparent electrodes (such as ITO) are commercially available to the display industry. They are made by several techniques including dyeing, pigment-dispersing, printing and electrodepositioning [M. Tani and T. Sugiura, Digest of SID 94 (Orlando, Fla.)]. Another approach to achieve the color filters in FIG. 6 is to use multilayer dielectric coating based on optical interference. Because of better stability, pigment dispersion has so far become the major process used in large-scale manufacturing.

Figure 7:
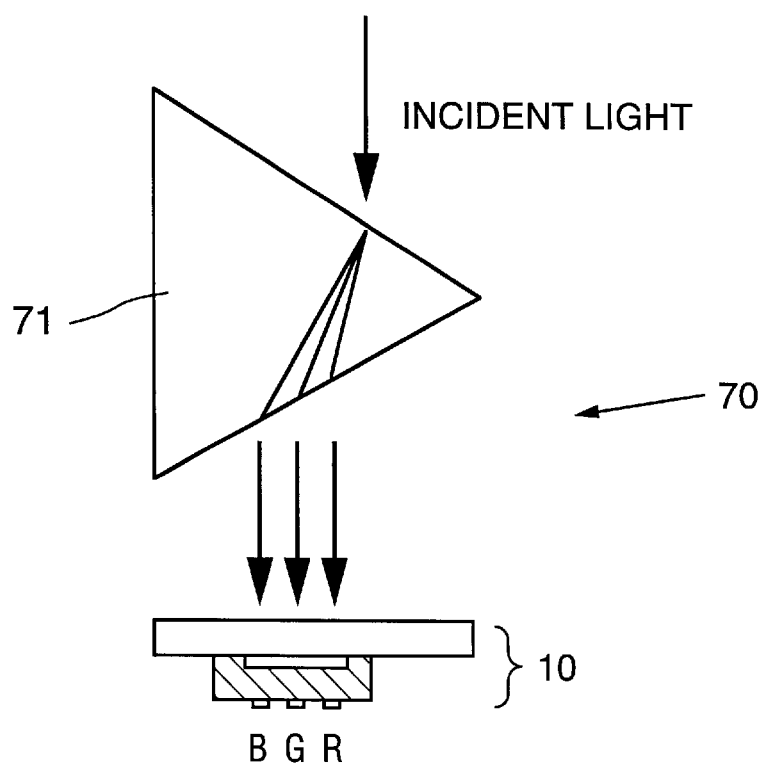
FIG. 7 shows the cross-sectional structure of a full-color image element (70) comprised of red, green and blue sub-pixels, which is made with three identical broad bandsorganic sensors and an optical dispersion device (a prism or a grating)

Full-color image elements were fabricated in the structure shown in FIG. 7 as 70. Three identical broad band photosensors are used as the sensing elements. Both structures shown in FIG. 1 as 10 can be used for the sensor pixels. Red, green and blue color selection and position to the three pixels can be achieved by a prism 71 in front of the device. With an optical plate comprising an array of micro-prisms arrayed in front of the glass/ITO substrate (or integrated together), color sensors and full-color image elements are achieved. Other light dispersing devices Such as grating films can also be used for the color selection. The bandwidth of the color pixels can be adjusted through the pixel size and the relative position between the sensor panel and the dispersion devices (prisms or gratings). It can also be adjusted by the width of a slit placing in front of the dispersion devices. This approach is especially suitable for construction large size full-color scanner arrays with high color purity.

The approaches of multi-color image sensors disclosed in this invention are not restricted by the applications of red, green and blue sensors. They can be used to construct multiple band photosensors with special usage and with desired spectral response. An example of UV plus visible two band photosensor (which can be used to construct sensor matrices) is disclosed in Example 13.

Using an approach similar to that shown in FIG. 2, an organic photosensor and sensing element with response nearly identical to that of the human eye is disclosed in the Example 8.

EXAMPLES

Example 1

Figure 8:
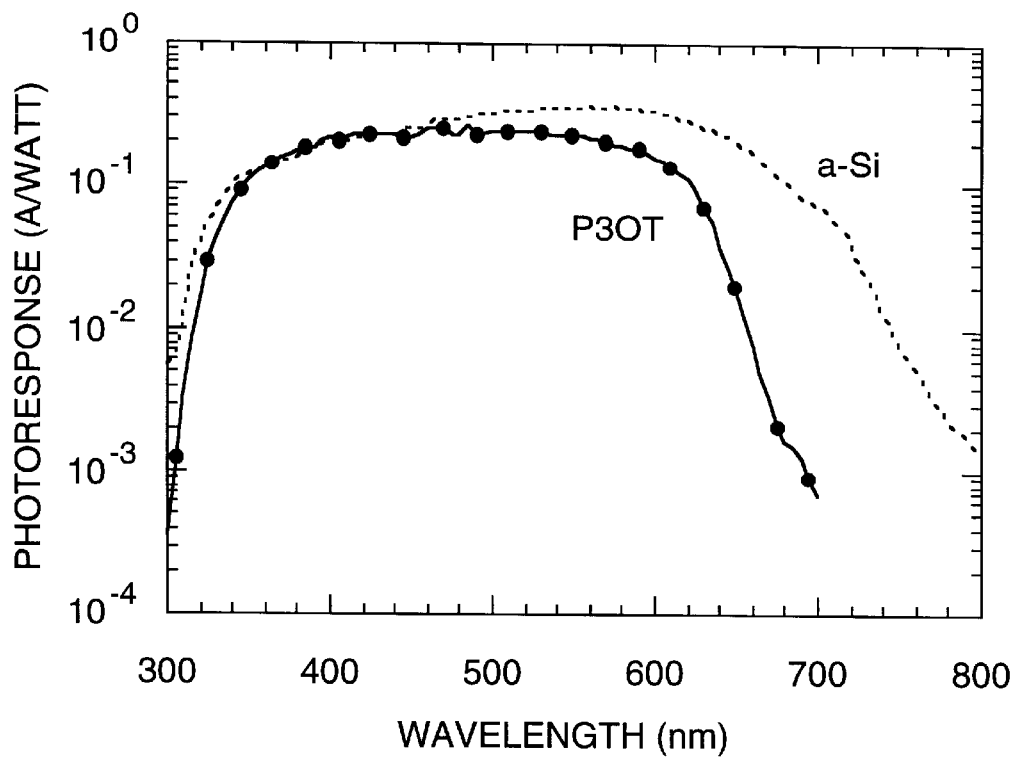
FIG. 8 is a graph which shows the photoresponse of an image element made in the ITO/P3OT/Au structure and is compared with that of photovoltaic cell made with amophous silicon.

Image elements were fabricated in the metal/polymer/metal sandwich structure as shown in FIG. 1A. In this example, a thin P3OT film (12) of ~2000 Å was spin-cast onto a transparent ITO/glass substrate (11/14) at room temperature. A gold layer was then evaporated on top as the counter electrode (13). Since the work function of Au is higher than that of ITO, the anode of this device is Au and the transparent ITO electrode is the cathode electrode. This device shows high photoresponse in the visible and in the UV. A photoresponse data set measured under –15V bias is shown in FIG. 8, and is compared with the photoresponse of a photovoltaic cell made with amorphous silicon.

This example demonstrates that the polymer photosensors can be used for detection of visible and UV light with high photoresponsitivity. The quantum efficiency is as good as that of photocells made with inorganic semiconductors.

Example 2

Image elements were fabricated with MEH-PPV films and with PPV films in the configuration of FIG. 1A. Patterned ITO on glass substrate was used as the substrate, and Al was used as the counter electrode (13). At –10 V bias, the photosensitivity of MEH-PPV photocells was 50~100 mA/Watt for photon energy shorter than 580 nm; thus demonstrating an organic photosensor sensitive to the green and blue portions of the visible spectrum. The photosensitivity of PPV photocells was 50–150 mA/Watt for photon energy shorter than 480 nm; thus demonstrating an organic photosensor only sensitive to blue and UV radiation.

This example demonstrates that the long wavelength cutoff of the spectral response can be varied by proper selection of the organic photosensing material.

Example 3

Figure 9:
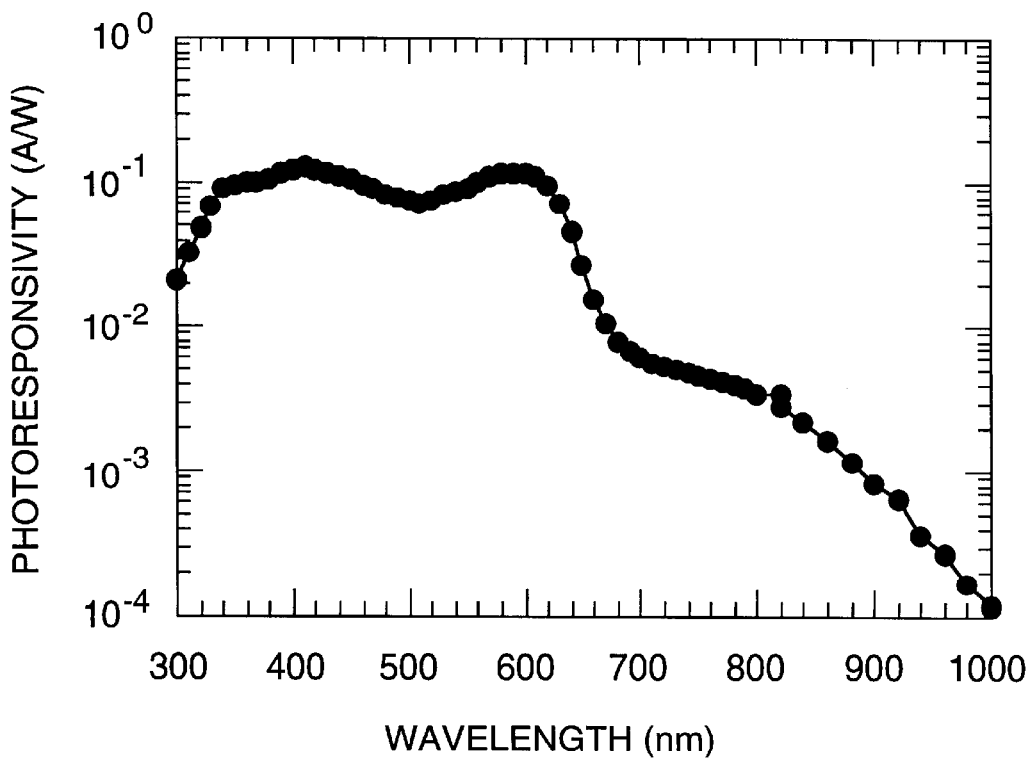
FIG. 9 is a graph which shows the photoresponse of an image element made in the ITO/P3OT:$C_{60}$ blend/Al structure.

The experiment of Example 2 was repeated with a polymer charge transfer blend made with P3OT:PCBM in which PCBM is a fullerene molecule with electronic properties similar to that of $C_{60}$. The spectral response of the image elements with thickness ~2500 Å is shown in FIG. 9. The data were obtained under reverse bias of −2V. The response profile is similar to that of P3OT devices for wavelength shorter than 650 nm. The response tails into the near infrared for wavelength longer than 800 nm.

This example demonstrates that high photoresponsivity can be achieved in organic photodiodes made with charge transfer blends at low bias voltage (field). The spectral response can cover the UV, visible and near infi-arcd spectral region by proper selection of the organic materials.

Example 4

Figure 10:
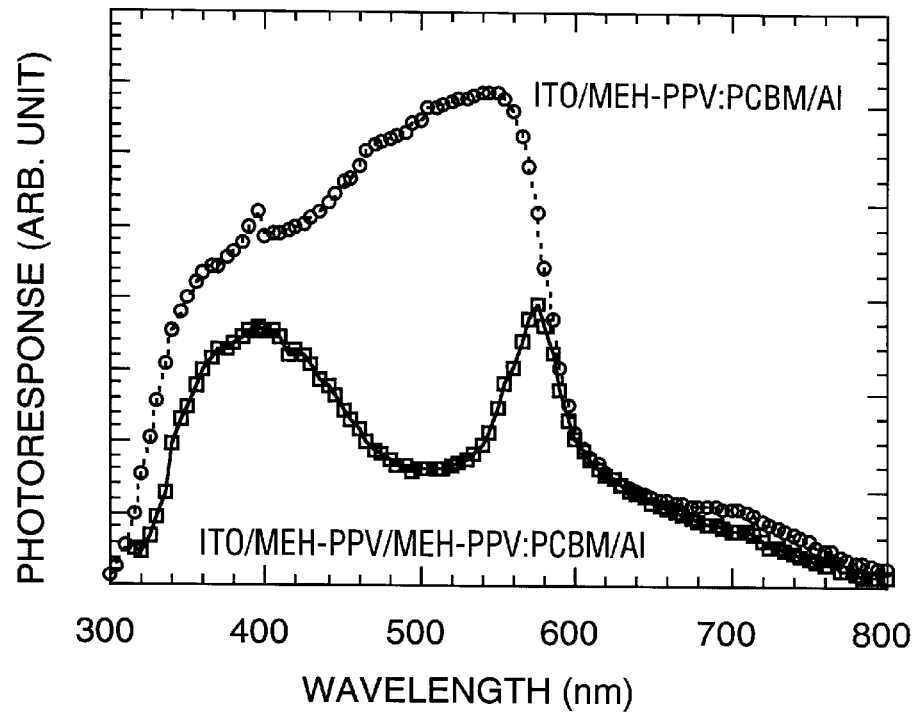
FIG. 10 is a graph which shows the photoresponse of an image element made in the ITO/MEH-PPV/MEH-PPV:PCBM blend/Al structure (squares) and compared with the device without the MEH-PPV layer (circles)

Image elements were fabricated in an ITO/MEH-PPV (1000 Å)/MEH-PPV:PCBM(1000 Å)/Al structure. The spectral response is shown in FIG. 10. The MEH-PPV layer in these devices provided multiple functions. Because of the better film forming property, the MEH-PPV layer acted as a buffer layer to improve the device stability. With an optical gap at ~590 nm, it acted as an optical filter and modified the spectral response of the MEH-PPV:PCBM device without the MEH-PPV buffer layer.

This example demonstrates that high photoresponsivity can be achieved in a multiple layer structure. A buffer layer with high film quality, designed optical transmission property, and good carrier transport property can be inserted in the device and serves with multiple functions. The spectral response of an image element can be varied with a buffer layer.

Example 5

Figure 11:
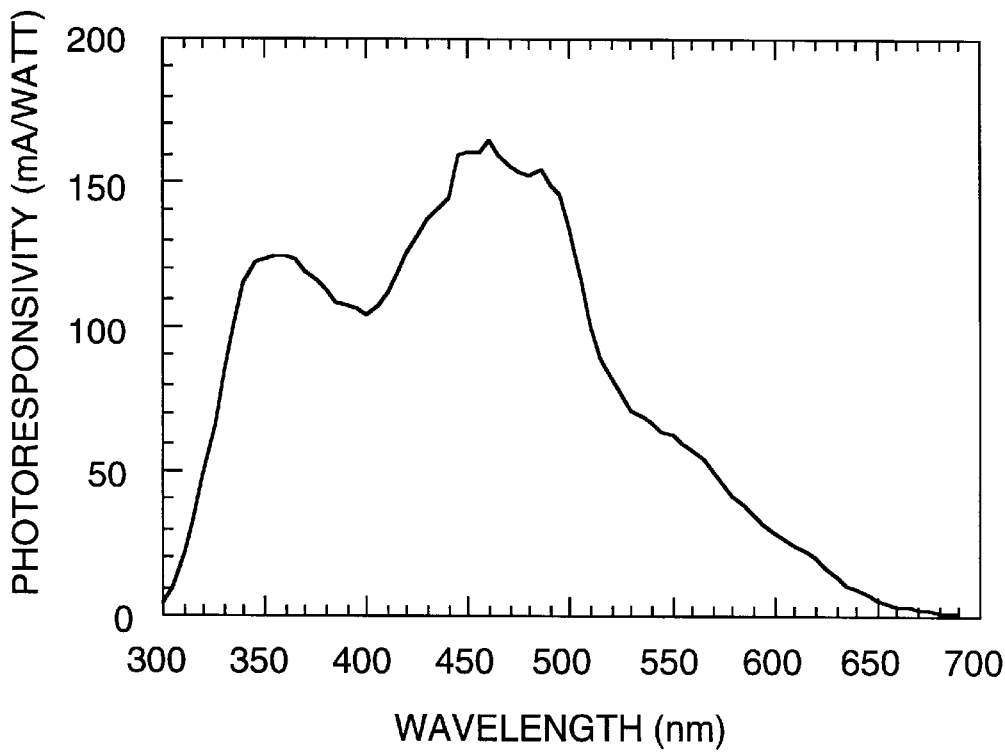
FIG. 11 is a graph which shows the photoresponse of an image element made in the ITO/PPV/$C_{60}$/Al structure.

Image elements were fabricated in the ITO/PPV/$C_{60}$/Al bilayer (heterojunction) structure. The thickness of each organic layer was ~1000 Å. The PPV precursor film was spin-cast from 1% ACN solution at room temperature. The precursor film was than converted into conjugated PPV by heat treatment at 200° C. for 2 hours. The $C_{60}$ layer was deposited by thermal evaporation in a vacuum chamber of $10^{-6}$ torr. The spectral response obtained from these image elements is shown in FIG. 11. The data were obtained with the device under reverse bias of −10 V.

This example demonstrates that high photoresponsivity can be achieved in organic photodiodes made in the heterojunction structure. The spectral response can cover the UV, visible and near infrared spectral regions by proper selection of the organic materials.

Example 6

Figure 12A:
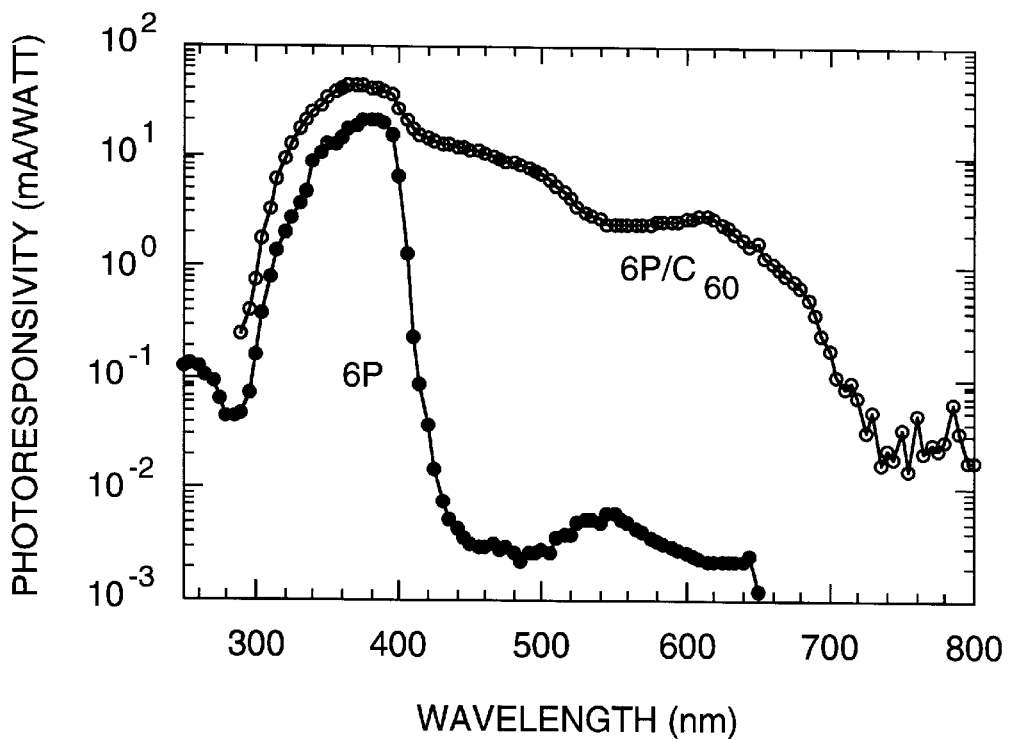
FIG. 12A is a graph which shows the photoresponses of image elements made in the ITO/6P/Al and ITO/6P/$C_{60}$/Al structures.
Figure 12B:
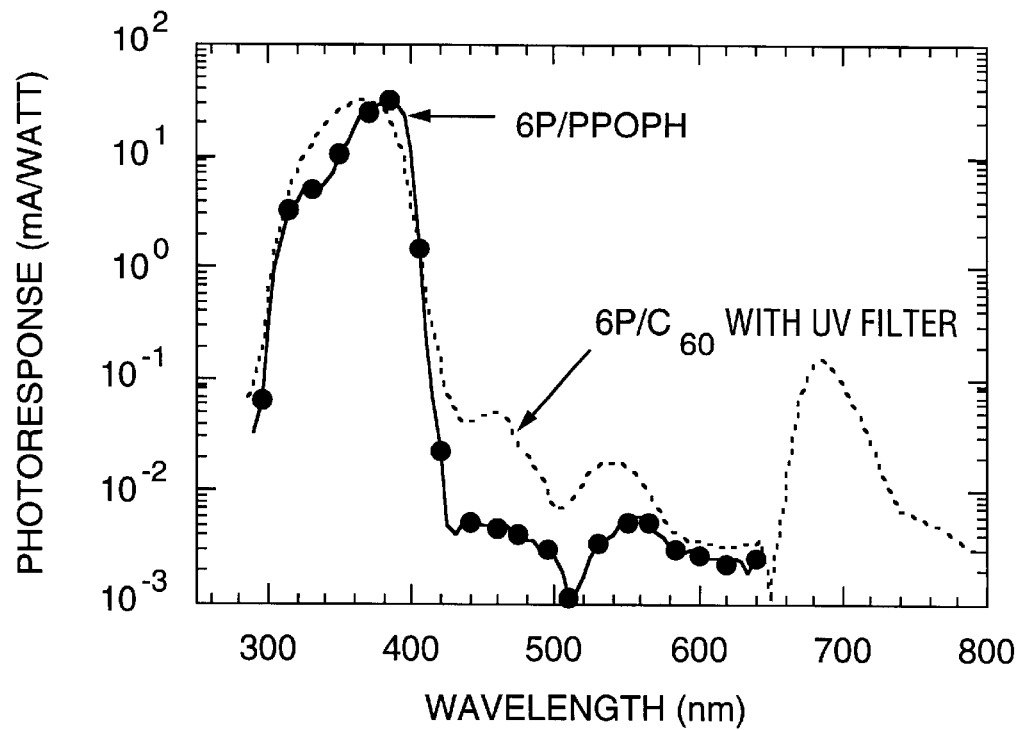
FIG. 12B is a graph which shows the visible blind UV response of image elements made in the structures of ITO/6P/$C_{60}$/Al coupled with a UV filter and ITO/6P/PPOPH/Al.

Image elements were fabricated with organic molecules in single layer and bilayer structures. The spectral responses of a sexiphenyl (6P) device and a 6P(800 Å)/$C_{60}$(800 Å) hetcrojunction device (sandwiched between ITO and Al electrodes) are shown in FIG. 12A. They were measured under reverse bias of −10 V. The organic films were thermally deposited in a vacuum chamber. The photoresponse of 6P devices is purely in the UV. The short wavelength cutoff is caused mainly by the transmission of the ITO electrode. By substituting the ITO electrode with a semitransparent polymer electrode such as PANI-CSA or PPy, the photosensitivity was extended to 230 nm. In the 6P/$C_{60}$ heterojunction devices, the magnitude of the photosensitivity was enhanced, and the spectral region of sensitivity was extended into the visible spectral range through absorption by the $C_{60}$. The photosensitivity in the visible was adjusted by varying the thicknesses of the $C_{60}$ and 6P layers. UV-only (without sensitivity in the visible) detection was achieved by placing a UV transmissive bandpass filter in front of the 6P(800 Å)/$C_{60}$(3000 Å) as shown in FIG. 12B.

Wide-band electron acceptor can also be used to substitute the $C_{60}$ layer. The photoresponsivity of an ITO/6P/PPOPH/Al device is also shown in FIG. 6*b*. Visible blind-UV detection is achieved without optical filter with photosensitivity over 20 mA/Watt, comparable to that in phototubes made with cathode materials (for example, Orial, #R5764, Orial catalog, 1994).

This example demonstrates that high photoresponsivity can be achieved in organic photodiodes made with organic molecules. The spectral response can cover the UV, visible and near infrared spectral regions by proper selection of the organic materials. The spectral response can also be adjusted by varying the thicknesses of the organic layers. UV-only detection without sensitivity in the visible can be achieved with UV-only sensitive organic materials or with a broad band sensor coupled with a UV pass optical filter.

Example 7

The experiments of Example 6 were repeated with poly (p-phenylene) (PPP), PPP derivatives and with PCBM, a $C_{60}$ derivative with improved solubility. Using PPP derivatives which are soluble in organic solvents, single layer PPP devices, PPP/$C_{60}$ bilayer devices, and PPP:$C_{60}$ blend devices were fabricated by spin casting. Results similar to those shown in FIG. 12 were obtained.

This example demonstrates that the UV detectors can be fabricated by spin-casting using soluble molecules and polymers.

Example 8

Figure 13:
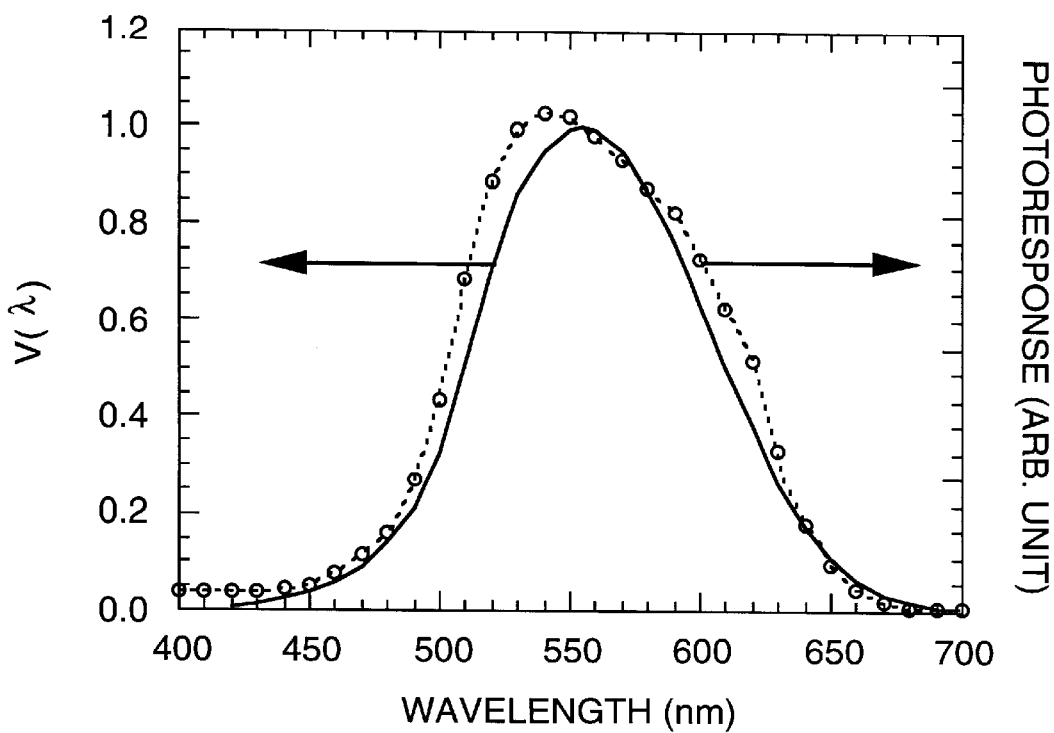
FIG. 13 is a graph which shows the photoresponse of an image element made with PPV/PANI-CSA/P3OT/Al in comparison with the visual response of standard human eye V($\lambda$)

Image elements were fabricated with P3OT and PPV films in the PPV/ITO/P3OT/Al structure. A PPV film was used as an optical filter in front of the diodes. The photoresponse is shown in FIG. 13 and compared with the visual response of standard human eye V(λ).

This example demonstrates that image elements can be made with organic photosensors; said image elements having photoresponse which closely matches that of the human eye. The output of such image sensors is, therefore, proportional to luminous intensity rather than to the radiation energy. This example, along with Example 2, also demonstrated that the spectral response of the image elements can be manipulated to desired wavelength range by selection of organic film thickness, the optical gap of the organic material and optical filter layers in front of the image elements.

Example 9

Full-color image elements were fabricated in the structure shown in FIG. 2D with red, green and blue three-color recognition. They were constructed with three organic photodetectors with different optical gaps. The device was fabricated on a silicon wafer with an Al electrode, reminiscent a hybridized device with a readout circuit made of silicon technology. The red sensor pixel was made from P3HT with thickness of ~2000 Å. A thin layer gold (~200 Å) was then deposited on top of the red pixel area. The area of the red polymer was than defined by removing the P3HT film (by laser ablation or plasma etching) in the areas for the green and blue pixels (see FIG. 2A). The green sensor was made with an MEH-PPV film (1500 Å), with a 200 Å Au electrode on top. The MEH-PPV film (on top of the red pixel) also acts as the short wavelength cut filter for the red sensor (see FIG. 2B). The MEH-PPV film in the blue pixel area was then removed and the blue sensor was fabricated by casting a layer of BuEH-PPV and evaporating the top Au electrode. No patterning was necessary for the organic film for the blue sensor (see FIG. 2D).

Figure 14:
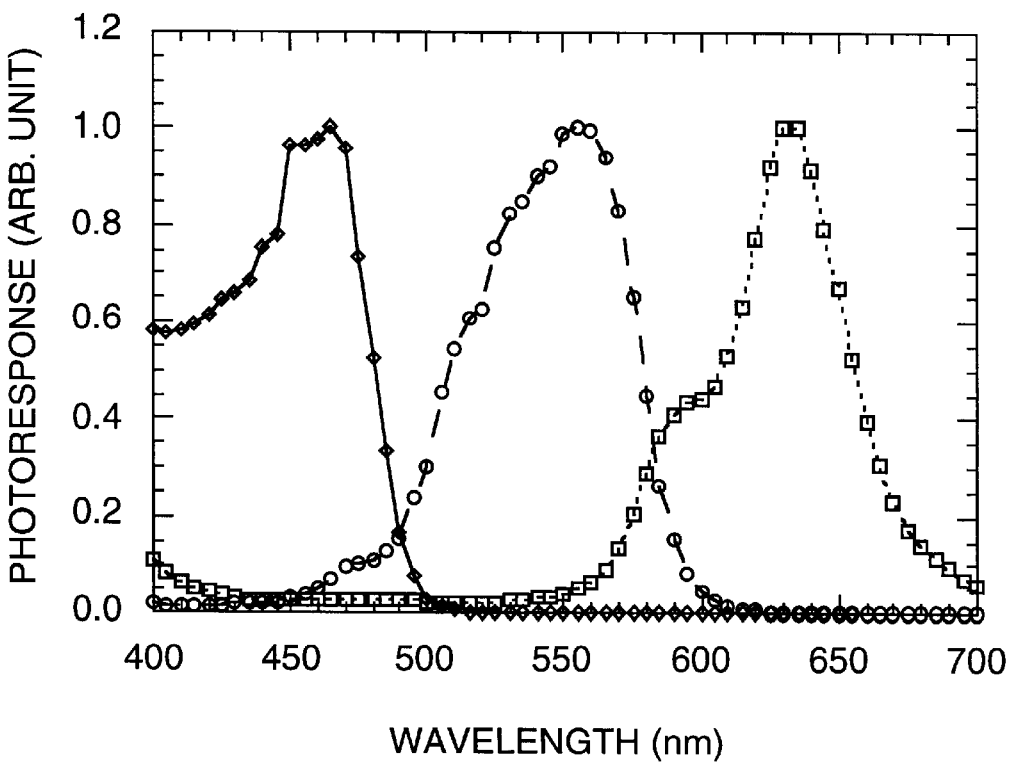
FIG. 14 is a graph which shows the photoresponse of a full-color image element comprised of red, green and blue pixels fabricated in the configuration shown in FIG. 2D.

The spectral responses of the red, green and blue color pixels were measured; the results are shown in FIG. 14. The red, green and blue responses are very close to the corresponding CIE chromaticity color standards. The spectral response can be adjusted in detail by varying the optical gaps and the thicknesses of the sensing layers.

Similar experiments were repeated with other substrates such as glass or quartz. The device performance (current-voltage characteristics, spectral response etc.) was not sensitive to the substrate materials.

A transparent coating was placed in front of the semi-transparent Au electrode, and the spectral response of the color pixels was re-tested. It was found that a transparent dielectric coating in front of the top electrode can vary the spectral response, and can enhance the photosensitivity at certain wavelengths.

This example demonstrates that red, green and blue color sensors and full-color image pixels can be fabricated in the configuration shown in FIG. 2, without need for additional color filters. The fabrication process can be carried out at room temperature; no substrate heating is required.

This "reversed" structure is especially suitable for hybridization with active circuits (switching devices, drivers and read-out circuits) made on semiconductor wafers or on insulating substrates.

Example 10

Full-color image elements were fabricated in the structure shown in FIG. 3A with red, green and blue sensors fabricated in the stack configuration. They were constructed with three organic photodetectors, each with a different long wavelength cut-off, at 500 nm, 600 nm and 700 nm, similar to the materials used in the Example 9. The device was fabricated on a glass substrate with a Patterned ITO electrode (31). The blue sensor was fabricated with a layer of PPV film (~2000 Å) and coated with a thin (100–400 Å), semitransparent Al electrode (32).

The Al electrode (32) also served as the cathode of the green sensor. The green sensor was made of MEH-PPV film (~2000 Å). Then a thin (100–400 Å), semitransparent Au layer (33) was vacuum deposited. The Au electrode serves as the common anode for the green and red sensors. This anode electrode can also be made with organic conducting materials with better optical transmission. The red sensor was made from P3HT (thickness of ~2000 Å). Finally an Al electrode (34) was deposited on top of the P3HT film, and served as the cathode of the red sensor.

Figure 15:
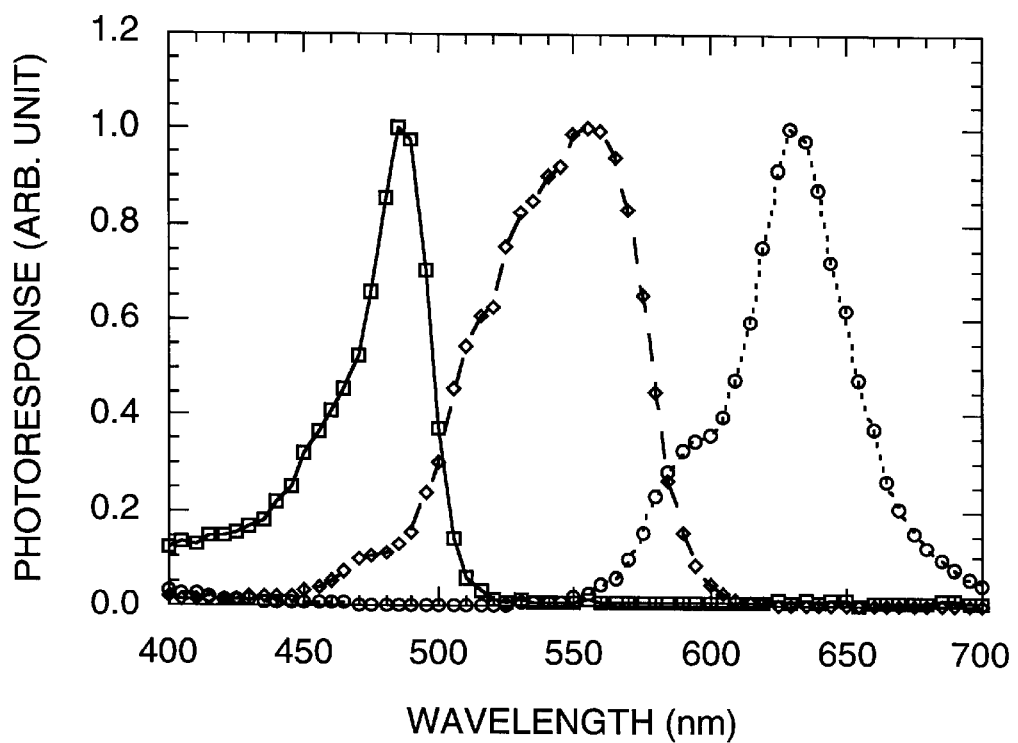
FIG. 15 is a graph which shows the photoresponse of a full-color image element comprised of red, green and blue pixels fabricated in the configuration shown in FIG. 5A.

The spectral responses of the red, green and blue color pixels were measured; the results are shown in FIG. 15. The blue sensor layer served also as a blue-color cut filter for the green sensor and the red sensor. Similarly, the green sensor layer also served as the green-color cut filter for the red sensor. The spectral responses were, thus, adjusted by the optical gaps of each sensor to match the CIE color standard accurately. In fact, these multi-color image elements are not restricted to the red, green and blue spectral region. They can be defined to any desired spectral regions from UV to near infrared.

Full-color image elements were also fabricated in the stacked structure shown in FIG. 3B. In this case, an optical opaque substrate (silicon wafer) was used as the substrate material. The stacking order of the color sensors was opposite to that shown in FIG. 3A, with the red sensor closest to the substrate. In this case, BuEH-PPV (a blue sensing material which is soluble at room temperature) was used for the blue sensor. A transparent polymer electrode was used as the top electrode (31).

Full-color image elements were also fabricated in the stacked structure shown in FIG. 4, in which dielectric layers were inserted in each metal/organic/metal sensors.

This example demonstrates that red, green and blue color sensors and full-color image pixels can be fabricated in the configurations shown in FIG. 3, FIG. 3' and FIG. 4 without additional color filters. These structures are not only suitable for fabricating column-row addressable passive image sensors, but also readily hybridized with active circuits such as microswitch devices made by metal-oxide-semiconductor (MOS) techniques on semiconductor wafers or on insulating substrates. The structures in FIG. 4 may find usage in situations when the organic layer is subject to cross contamination during the fabrication process or in cases when circuit isolation between color sensors is needed.

Example 11

Full-color image elements were fabricated in the structure shown in FIG. 5A. In this case, a broad band photosensor made with P3HT was used as the sensing element for all the color pixels. Red, green and blue color selection was achieved by a matrix of optical etalons integrated in front of the sensor layer. Glass was used as the substrate. A layer of Al (~500 Å) was deposited on top of the glass as a mirror of the etalon. A layer transparent to visible light (6P in this experiment) was then deposited by thermal evaporation. The thickness (d) of the 6P layer was adjusted at each sensor site to be ~2nd=650 nm, 550 nm and 450 nm, where n~1.6 is the index of refraction of 6P. An Au film (300–500 Å) was then deposited on the 6P layer and patterned into the pixel size. P3HT was then spin cast from a 3% toluene solution at room temperature. An Al layer was then deposited as the cathode electrode of the sensing elements.

The spectral responses of the red, green and blue color pixels are gausion type, centered at ~650 nm, ~550 nm and ~450 nm respectively. They are mostly determined by the transmission characteristics of the etalons (which function as optical filters in this case). The detail bandwidth and the central frequency of the transmission band can be adjusted by the thickness of the Al and Au electrodes (51, 53) to fit the CIE color standard. This method provides full-color image elements with high quality spectral purity. These multi-color image elements are not restricted to the red, green and blue spectral regions. They can be designed to any desired spectral regions from UV to near infrared with specific bandwidth.

Full-color image elements were also fabricated in the structure shown in FIG. 5B. In this case, an optically opaque substrate (silicon wafer) was used as the substrate material. The sensor elements were fabricated first with P3HT, and the etalon resonators with optical transmission in red, green and blue region were than fabricated.

This example demonstrates that red, green and blue color sensors and full-color image pixels can be fabricated in the configuration shown in FIG. 5, by integration of wide-band organic photosensors with optical etalon devices. No substrate heating was involved in the fabrication. The etalons provide the color filters with high color purity. A metal layer with limited optical transmission was used as the anode of the sensor; a configuration which is especially suitable for high pixel density applications in which low resistance is required for contact electrode and connection. This structure is not only suitable for fabricating column-row addressable passive image sensors, but also readily hybridized with active circuits (such as a CMOS driver or a TFT matrix) made on silicon wafers or glass, sapphire, or polymer substrates.

Example 12

Figure 16A:
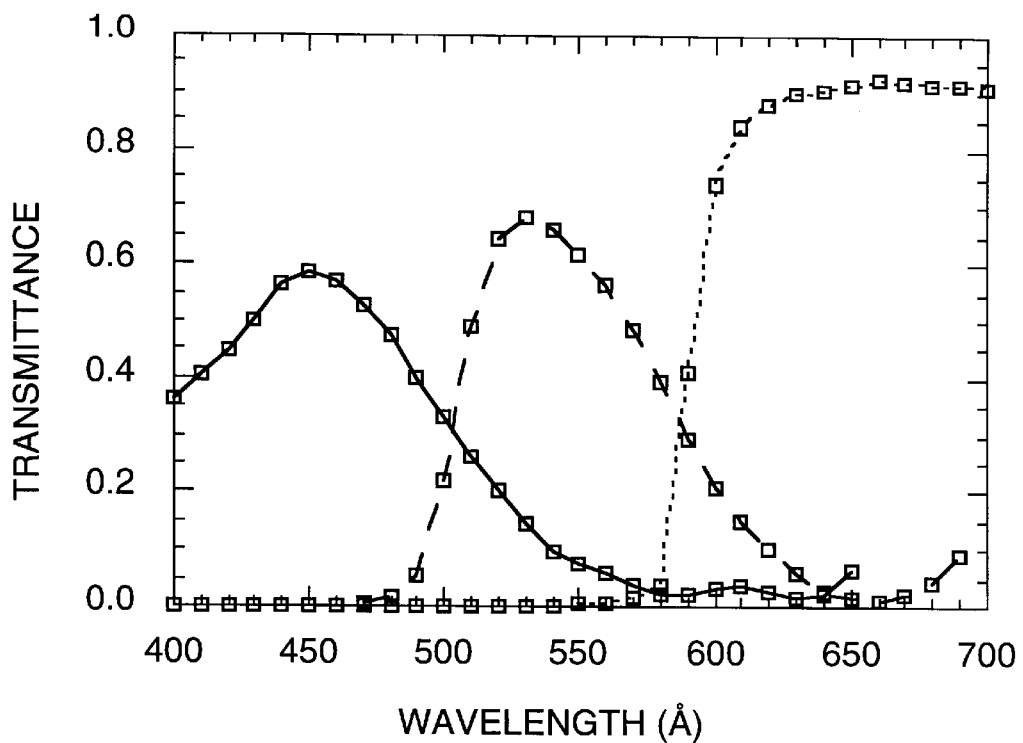
FIGS. 16A and 16B are graphs which show (a) the photoresponse of a full-color image element comprised of red, green and blue pixels fabricated in the configuration shown in FIG. 6, and (b) the transmission characteristics of the color filters used.
Figure 16B:
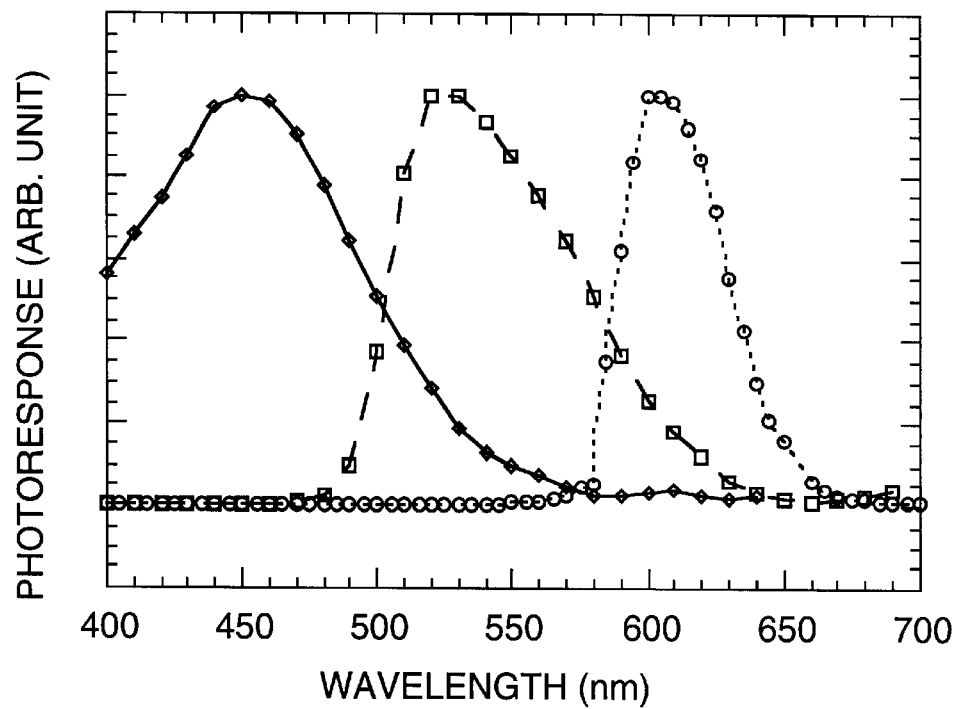

Full-color image elements were fabricated in the structure shown in FIG. 6. A broad band photosensor made with P3HT was used as the sensing elements. ITO/color filter/glass substrate was used as the color selecting anode electrode. This type of substrate is an existing art which has been used broadly in the fabrication of LCD color displays. Color sensors and full-color image elements can be fabricated in two steps: polymer coating and counter electrode forming. Ag was used as the counter electrode. The transmittance of the ITO/color filter/glass substrate and the corresponding spectral response of the image elements are shown in FIG. 16.

This example demonstrates that red, green and blue color sensors and full-color image pixels can be fabricated in two simple steps in the configuration shown in FIG. 6, using a commercially available ITO/color filter/glass substrate. This image element can be used to construct column-row addressable passive photodiode arrays as well as the sensing elements in active sensors. The sensor matrix can be hybridized with a CMOS driver on silicon wafer or a TFT matrix made with inorganic or organic semiconductors.

Example 13

Full-color image elements were fabricated in the structure shown in FIG. 7. Three broad band photosensors made with P3HT were used as the sensing elements. An ITO/glass substrate was used as the anode electrode. Red, green and blue color selection and position relative to the three pixels were achieved by placing a prism in front of the device. Using an optical plate with an array of prisms in front of the glass/ITO substrate, color sensors and full-color image elements were demonstrated in two steps: polymer coating and counter electrode forming. The spectral response of the image elements was measured and found to be similar to that obtained from the broad band, monochromatic image clement (for an example, see FIG. 8), but divided into three discrete sections in the red, green and blue regions, respectively, at the conesponding pixels.

This example demonstrates that red, green and blue color sensors and full-color image pixels can be fabricated in the configuration shown in FIG. 7, with two simple steps using a commercially available ITO/color filter/glass substrate. This image element can be used to construct column-row addressable passive photodiode arrays as well as the sensing elements in active sensors. The sensor matrix can be hybridized with a CMOS driver on silicon wafer or a TFT matrix made with inorganic or organic semiconductors.

Example 14

Figure 17:
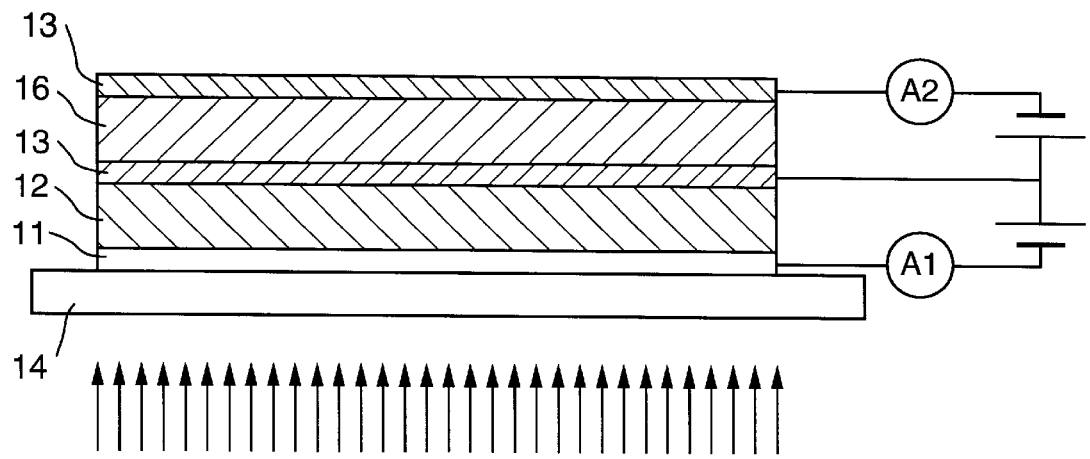
FIG. 17 is a schematic cross-sectional view of the test circuit used to produce the data of FIG. 16A.
Figure 18:
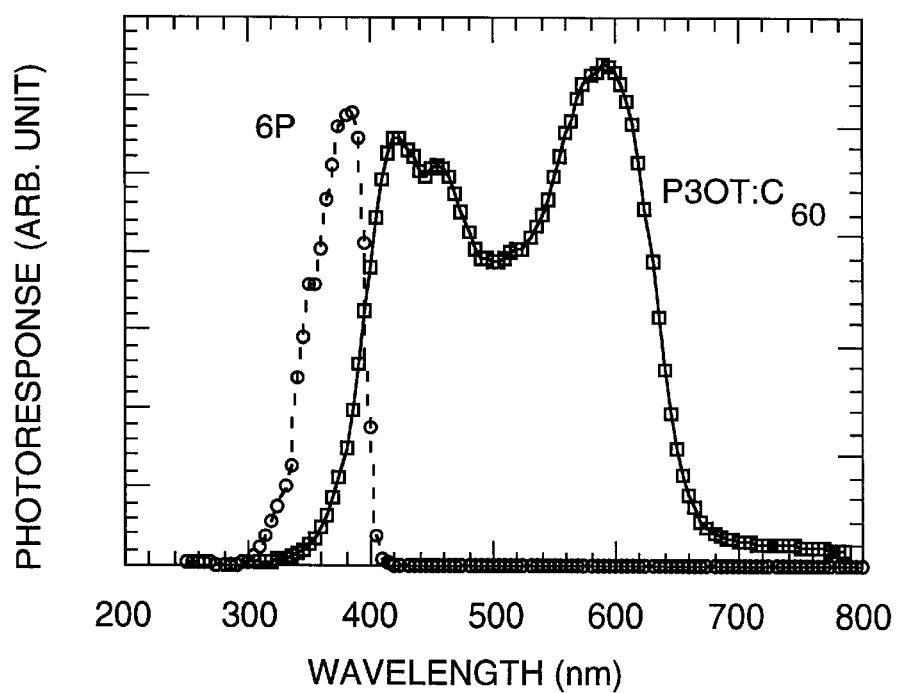
FIG. 18 is a graph which shows the photoresponse of an image element which is sensitive to two spectral bands in the UV and in the visible.

UV and visible dual-color image elements were fabricated in the stacked structure similar to that of Example 10. The layer order from the glass substrate is as follows: ITO/6P (2000 Å)/Al(300 Å)/P3OT:$C_{60}$(2000 Å)/Au. The numbers in the brackets are the thicknesses of the corresponding layers. This sensor was connected in a circuit shown in FIG. 18. An Al layer was used as the common cathode of both sensors. The reading from the ITO/6P/Al sensor indicated the irradiation in the UV spectral region and the reading from the Al/P3HT/Au sensor indicated the radiation in the visible region of the spectrum. The spectral responses of these two sensors are shown in FIG. 17.

This example demonstrates an image element with two spectral bands in the UV and in the visible. These two signals can be probed simultaneously. By selecting proper sensing materials for each layer, photosensors with two (or more) spectral regions separated at a specific wavelength(s) can be achieved in the same manner.

Example 15

An organic photosensor was fabricated in the stricture of ITO/PPV/$C_{60}$/Al and was integrated with a mirror/liquid crystal/mirror type microcavity filter in the order similar to that shown in FIG. 5. The microcavity liquid crystal cell formed a narrow band optical filter which determines the spectral response of the integrated sensor. The band-width of the response profile can be varied by the reflectance of the mirrors. Aluminum was used for the mirror material sandwiching the liquid crystal layer. The response wavelength of the integrated detector can be selected by the thickness of the liquid crystal layer and can be tuned by a bias applied to the Au minors sandwiching the liquid crystal layer. This integrated device forms a flat-panel monochromator with spectrographic function. Such novel flat-panel monochromators can be used to measure spectral distribution of an incident beam.

Figure 19:
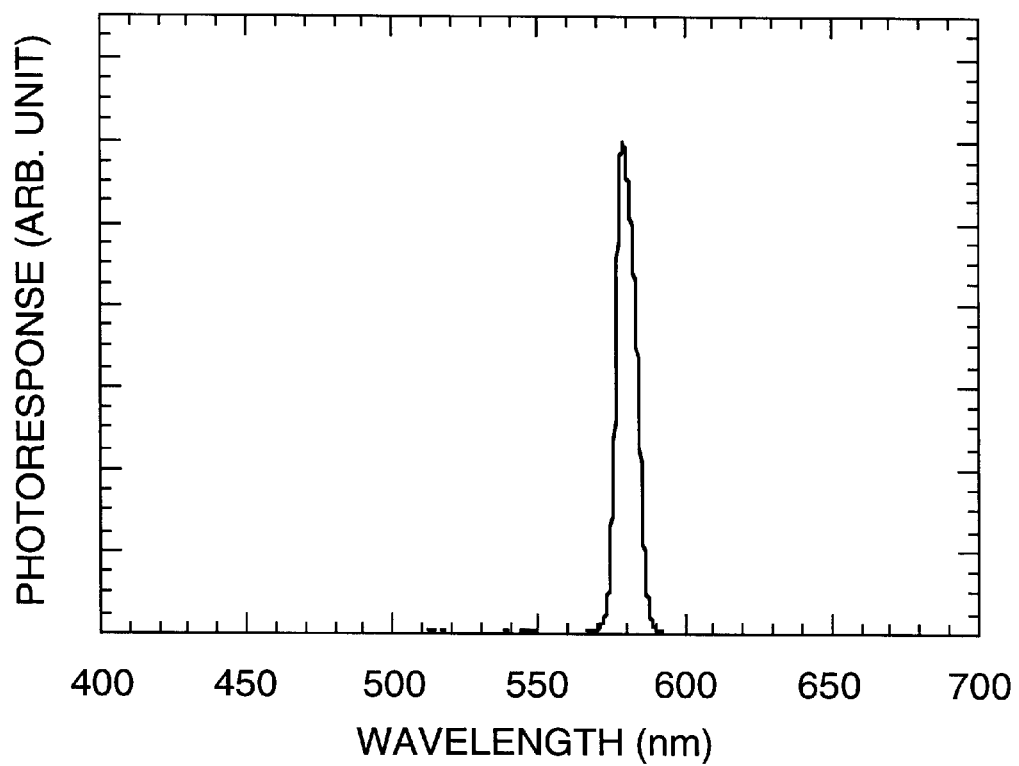
FIG. 19 is a graph which shows the spectral response of an organic photosensor with narrow-band spectral response.

The experiment was repeated with another type of wavelength adjustable optical filter—interfering filter. A wavelength adjustable interfering filter similar to the commercial product (Oriel, catelog number 7155) was placed in front of a broad band organic photodetector made in the structure of ITO/MEH-PPV:PCBM/Al. In contrast to the metal mirror used above, these interfering filters are made of dielectric coatings. The spectral response of the integrated device is shown in FIG. 19. The wavelength selection range was from 400 to 700 nm.

The result indicates that the integrated photosensor possesses narrow spectral response (~10 nm) and wavelength selectability (400–700 nm).

What is claimed is:

1. A sensing element capable of sensing more than one wavelength of light comprising
   a. a substrate;
   b. a first electrode disposed on the substrate;
   c. a first layer of a first photoactive organic material having an optical band gap corresponding to a first of the more than one wavelengths disposed on a first portion of the first electrode;
   d. a transparent second electrode disposed on the layer of first photoactive organic material, said first electrode, first layer of first photoactive organic material and said second electrode making up a first sensor capable of generating an electrical signal when light of the first wavelength is incident upon said first sensor;
   e. a second layer of a second photoactive organic material having an optical band gap corresponding to a second of the more than one wavelengths disposed on a second portion of the first electrode;
   f. a transparent third electrode disposed on the layer of second photoactive organic material, said first electrode, said layer of second photoactive organic material and said third electrode making up a second sensor capable of generating an electrical signal when light of the second wavelength is incident upon said second sensor, wherein the first photoactive organic material and the second photoactive organic material are conjugated semiconducting polymer materials.

2. The sensing element of claim 1 wherein one or more of said electrodes comprises a conductive organic material.

3. The sensing element of claim 1 wherein one or more of said electrodes comprises a metal.

4. The sensing element of claim 1 wherein the photoactive organic material comprises a material selected from the group consisting of organometallic molecules, conjugated polymers and semiconducting polymers.

5. The sensing element of claim 1 wherein the photoactive organic material comprises a conjugated, semiconducting polymers.

6. The sensing element of claim 1 additionally comprising a buffer layer between an electrode and an adjacent photoactive organic material layer.

7. The sensing element of claim 6, wherein the buffer layer comprises conducting polymers, such as polyaniline (PANI), polypyrrole (PPy), and polyethylene dioxythiophene polystyrene sulfonate (PEDT-OSS); a thin layer of organic or organometallic molecules; a thin layer of inorganic compounds, such as LiF, NaF, BaO, $Li_2O$, $Na_2O$, other metal-florets, metal-oxides and metal sulfites, or a thin layer of inorganic metals or metal alloys.

8. The sensing element of claim 1, wherein optical mirrors are incorporated into the electrodes so that the mirror-organic material layer/mirror forms a microcavity and possess selective response at resonance wavelengths.

9. The sensing element of claim 8, wherein the optical mirrors comprise inorganic and/or organic insulating (dielectric) layers selected with different dielectric constants and arranged in alternating fashion to form a DBR mirror.

10. The sensing element of the claim 1, wherein the supporting substrate comprises switching circuits hybridized with the sensing element.

11. A pixelated photodetector comprising the sensing element of claim 1.

12. A sensing element adapted for full visual color image comprising
   a. a substrate;
   b. a first electrode disposed on the substrate;
   c. a first layer of a first photoactive organic material having an optical band gap at about 700 nm disposed on a first portion of the first electrode;
   d. a transparent second electrode disposed on the layer of first photoactive organic material, said first electrode, first layer of first photoactive organic material and said second electrode making up a red sensor capable of generating an electrical signal when red light is incident upon said red sensor;
   e. a second layer of a second photoactive organic material having an optical band gap at about 600 nm disposed on a second portion of the first electrode;
   f. a transparent third electrode disposed on the layer of second photoactive organic material, said first electrode, said layer of second photoactive organic material and said third electrode making up a green sensor capable of generating an electrical signal when green light is incident upon said green sensor;
   g. a third layer of a third photoactive organic material having an optical band gap at about 500 nm disposed on a third portion of said first electrode;
   h. a transparent fourth electrode disposed on the layer of third photoactive organic material; said first electrode, said layer of third photoactive organic material and said fourth electrode making up a blue sensor capable of generating an electrical signal when blue light is incident upon said blue sensor.

13. The image sensing element of claim 12 wherein the first, second, and third portions of said first electrode are continuous.

14. The image sensing element of claim 12 wherein the first, second, and third portions of said first electrode arc separate.

15. The image sensing element of claim 12 wherein said layer of second photoactive organic material covers the red sensor and functions as a short wavelength cut filter and wherein said layer of third photoactive organic material covers the green sensor and green sensor and functions as a mid wavelength cut filter.

16. A sensing element capable of sensing more than one wavelength of light comprising
   a. a transparent substrate;
   b. a transparent first electrode disposed on the substrate;
   c. a first layer of a first photoactive organic material having an optical band gap corresponding to a first of the more than one wavelengths disposed on a first portion of the first electrode;
   d. a transparent second electrode disposed on the layer of first photoactive organic material, said first electrode, first layer of first photoactive organic material and said second electrode making up a first sensor capable of generating an electrical signal when light of the first wavelength is incident upon said first sensor;
   e. a second layer of a second photoactive organic material having an optical band gap corresponding to a second of the more than one wavelengths disposed on a second portion of the first electrode;
   f. a third electrode disposed on the layer of second photoactive organic material, said first electrode, said layer of second photoactive organic material and said third electrode making up a second sensor capable of generating an electrical signal when light of the second wavelength is incident upon said second sensor,
      wherein the first photoactive organic material and the second photoactive organic material are conjugated semiconducting polymer materials.

17. A sensing element adapted for full color visual image sensing comprising
   a. a transparent substrate;
   b. a first transparent electrode disposed on the substrate;
   c. a first layer of a first photoactive organic material having an optical band gap at about 500 nm disposed on a first portion of the first electrode;
   d. a transparent second electrode disposed on the layer of first photoactive organic material, said first clectrode, first layer of first photoactive organic material and said second electrode making up a blue sensor capable of generating an electrical signal when blue light is incident upon said blue sensor;
   e. a second layer of a second photoactive organic material having an optical band gap at about 600 nm disposed on a second portion of the first electrode;
   f. a transparent third electrode disposed on the layer of second photoactive organic material, said first electrode, said layer of second photoactive organic material and said third electrode making up a green sensor capable of generating an electrical signal when green light is incident upon said green sensor;

g. a third layer of a third photoactive organic material having an optical band gap at about 700 nm disposed on a third portion of said first electrode;

h. a fourth electrode disposed on the layer of third photoactive organic material; said first electrode, said layer of third photoactive organic material and said fourth electrode making up a red sensor capable of generating an electrical signal when red light is incident upon said red sensor.

18. The image sensing element of claim 17 wherein said layer of second photoactive organic material covers the blue sensor and functions as a mid wavelength cut filter and wherein said layer of first photoactive organic material covers the blue sensor and green sensor and functions as a short wavelength cut filter.

19. A sensing element capable of sensing more than one wavelength of light comprising a. a substrate;

b. a first electrode disposed on the substrate;

c. a first layer of a first photoactive organic material having an optical band gap corresponding to a first of the more than one wavelengths disposed on the first electrode;

d. a transparent second electrode disposed on the layer of first photoactive organic material, said first electrode, said first layer of first photoactive organic material and said second electrode making up a first sensor capable of generating an electrical signal when light of the first wavelength is incident upon said first sensor;

e. a second layer of a second photoactive organic material having an optical band gap corresponding to a second of the more than one wavelengths disposed on the transparent second electrode;

f. a transparent third electrode disposed on the layer of second photoactive organic material, said second electrode, said layer of second photoactive organic material and said third electrode making up a second sensor capable of generating an electrical signal when light of the second wavelength is incident upon said second sensor, wherein the first photoactive organic material and the second photoactive organic material are conjugated semiconducting polymer materials.

20. A sensing element adapted for full color visual image sensing comprising a. a substrate;

b. a first electrode disposed on the substrate;

c. a first layer of a first photoactive organic material having an optical band gap at about 700 nm disposed on the first electrode;

d. a transparent second electrode disposed on the layer of first photoactive organic material, said first electrode, first layer of first photoactive organic material and said second electrode making up a red sensor capable of generating an electrical signal when red light is incident upon said red sensor;

e. a second layer of a second photoactive organic material having an optical band gap at about 600 nm disposed on the second electrode;

f. a transparent third electrode disposed on the layer of second photoactive organic material, said second electrode, said layer of second photoactive organic material and said third electrode making up a green sensor capable of generating an electrical signal when green light is incident upon said green sensor;

g. a third layer of a third photoactive organic material having an optical band gap at about 500 nm disposed on the third portion electrode;

h. a transparent fourth electrode disposed on the layer of third photoactive organic material; said third electrode, said layer of third photoactive organic material and said fourth electrode making up a blue sensor capable of generating an electrical signal when blue light is incident upon said blue sensor.

21. A sensing element capable of sensing more than one wavelength of light comprising a. a transparent substrate;

b. a transparent first electrode disposed on the substrate;

c. a first layer of a first photoactive organic material having an optical band gap corresponding to a first of the more than one wavelengths disposed on the first electrode;

d. a transparent second electrode disposed on the layer of first photoactive organic material, said first electrode, first layer of first photoactive organic material and said second electrode making up a first sensor capable of generating an electrical signal when light of the first wavelength is incident upon said first sensor;

e. a second layer of a second photoactive organic material having an optical band gap corresponding to a second of the new the one wavelengths disposed on the second electrode;

f. a third electrode disposed on the layer of second photoactive organic material, said first electrode, said layer of second photoactive material and said third electrode making up a second sensor capable of generating an electrical signal when electromagnetic radiation of the second wavelength is incident upon said second sensor, wherein the first photoactive organic material and the second photoactive organic material are conjugated semiconducting polymer materials.

22. A sensing element adapted for full color visual image sensing comprising a. a transparent substrate;

b. a first transparent electrode disposed on the substrate;

c. a first layer of a first photoactive organic material having an optical band gap at about 500 nm disposed on the first electrode;

d. a transparent second electrode disposed on the layer of first photoactive organic material, said first electrode, first layer of first photoactive organic material and said second electrode making up a blue sensor capable of generating an electrical signal when blue light is incident upon said blue sensor;

e. a second layer of a second photoactive organic material having an optical band gap at about 600 nm disposed on the second electrode;

f. a transparent third electrode disposed on the layer of second photoactive organic material, said second electrode, said layer of second photoactive organic material and said third electrode making up a green sensor capable of generating an electrical signal when green light is incident upon said green sensor;

g. a third layer of a third photoactive organic material having an optical band gap at about 700 nm disposed on the third electrode;

h. a fourth electrode disposed on the layer of third photoactive organic material; said third electrode, said layer of third photoactive organic material and said fourth electrode making up a red sensor capable of generating an electrical signal when red light is incident upon said red sensor.

23. A sensing element capable of sensing more than one wavelength of light comprising
 a. a substrate;
 b. a first electrode disposed on the substrate;
 c. a first layer of a first photoactive organic material having an optical band gap corresponding to a first of the more than one wavelengths disposed on the first electrode;
 d. a transparent second electrode disposed on the layer of first photoactive organic material, said first electrode, first layer of first photoactive organic material and said second electrode making up a first sensor capable of generating an electrical signal when light of the first wavelength is incident upon said first sensor;
 e. a dielectric layer disposed on the second transparent electrode;
 f. a transparent third electrode disposed on said dielectric layer;
 g. a second layer of a second photoactive organic material having an optical band gap corresponding to a second of the more than one wavelengths disposed on the third electrode;
 h. a transparent fourth electrode disposed on the layer of second photoactive organic material, said third electrode, said second layer of second photoactive organic material and said fourth electrode making up a second sensor capable of generating an electrical signal when light of the second wavelength is incident upon said second sensor,
  wherein the first photoactive organic material and the second photoactive organic material are conjugated semiconducting polymer materials.

24. A sensing element adapted for full color visual image sensing comprising
 a. a substrate;
 b. a first electrode disposed on the substrate;
 c. a first layer of a first photoactive organic material having an optical band gap at about 700 nm disposed on the first electrode;
 d. a transparent second electrode disposed on the layer of first photoactive organic material, said first electrode, first layer of first photoactive organic material and said second electrode making up a red sensor capable of generating an electrical signal when red light is incident upon said red sensor;
 e. a first dielectric layer disposed on the second transparent electrode;
 f. a transparent third electrode disposed on said first dielectric layer;
 g. a second layer of a second photoactive organic material having an optical band gap at about 600 nm disposed on the third electrode;
 h. a transparent fourth electrode disposed on the layer of second photoactive organic material, said third electrode, said layer of second photoactive organic material and said fourth electrode making up a green sensor capable of generating an electrical signal when green light is incident upon said green sensor;
 i. a second dielectric layer disposed on the fourth electrode;
 j. a transparent fifth electrode disposed on said second dielectric layer;
 k. a third layer of a third photoactive organic material having an optical band gap at about 500 nm disposed on the fifth portion electrode;
 l. a transparent sixth electrode disposed on the layer of third photoactive organic material; said fifth electrode, said layer of third photoactive organic material and said sixth electrode making up a blue sensor capable of generating an electrical signal when blue light is incident upon said blue sensor.

25. A sensing element capable of sensing more than one wavelength of light comprising
 a. a transparent substrate;
 b. a first transparent electrode disposed on the substrate;
 c. a first layer of a first photoactive organic material having an optical band gap corresponding to a first of the more than one wavelengths disposed on the first electrode;
 d. a transparent second electrode disposed on the layer of first photoactive organic material, said first electrode, first layer of first photoactive organic material and said second electrode making up a first sensor capable of generating an electrical signal when light of the first wavelength is incident upon said first sensor;
 e. a dielectric layer disposed on the second transparent electrode;
 f. a transparent third electrode disposed on said dielectric layer;
 g. a second layer of a second photoactive organic material having an optical band gap corresponding to a second of the more than one wavelengths disposed on the third electrode;
 h. a fourth electrode disposed on the layer of second photoactive organic material, said third electrode, said second layer of second photoactive organic material and said fourth electrode making up a second sensor capable of generating an electrical signal when light of the second wavelength is incident upon said second sensor,
  wherein the first photoactive organic material and the second photoactive organic material are conjugated semiconducting polymer materials.

26. A sensing element adapted for full color visual image sensing comprising
 a. a transparent substrate;
 b. a first transparent electrode disposed on the substrate;
 c. a first layer of a first photoactive organic material having an optical band gap at about 700 nm disposed on the first electrode;
 d. a transparent second electrode disposed on the layer of first photoactive organic material, said first electrode, first layer of first photoactive organic material and said second electrode making up a red sensor capable of generating an electrical signal when red light is incident upon said red sensor;
 e. a first dielectric layer disposed on the second transparent electrode;
 f. a transparent third electrode disposed on said first dielectric layer;
 g. a second layer of a second photoactive organic material having an optical band gap at about 600 nm disposed on the third electrode;

h. a transparent fourth electrode disposed on the layer of second photoactive organic material, said third electrode, said layer of second photoactive organic material and said fourth electrode making up a green sensor capable of generating an electrical signal when green light is incident upon said green sensor;

i. a second dielectric layer disposed on the fourth electrode;

j. a transparent fifth electrode disposed on said second dielectric layer;

k. a third layer of a third photoactive organic material having an optical band gap at about 500 nm disposed on the fifth portion electrode;

l. a sixth electrode disposed on the layer of third photoactive organic material; said fifth electrode, said layer of third photoactive organic material and said sixth electrode making up a blue sensor capable of generating an electrical signal when blue light is incident upon said blue sensor.

* * * * *